US011699772B2

(12) United States Patent
Dong et al.

(10) Patent No.: US 11,699,772 B2
(45) Date of Patent: Jul. 11, 2023

(54) ARRAY SUBSTRATE AND PREPARATION METHOD THEREOF, AND DIGITAL MICROFLUIDIC CHIP

(71) Applicants: Beijing BOE Sensor Technology Co., Ltd., Beijing (CN); BOE Technology Group Co., Ltd., Beijing (CN)

(72) Inventors: Xue Dong, Beijing (CN); Yue Geng, Beijing (CN); Peizhi Cai, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 300 days.

(21) Appl. No.: 17/044,027

(22) PCT Filed: Mar. 19, 2020

(86) PCT No.: PCT/CN2020/080258
§ 371 (c)(1),
(2) Date: Sep. 30, 2020

(87) PCT Pub. No.: WO2020/199936
PCT Pub. Date: Oct. 8, 2020

(65) Prior Publication Data
US 2021/0367094 A1 Nov. 25, 2021

(30) Foreign Application Priority Data
Apr. 1, 2019 (CN) .......................... 201910256479.8

(51) Int. Cl.
*H01L 31/18* (2006.01)
*H01L 27/144* (2006.01)
(Continued)

(52) U.S. Cl.
CPC .... *H01L 31/1876* (2013.01); *B01L 3/502784* (2013.01); *H01L 27/1446* (2013.01);
(Continued)

(58) Field of Classification Search
CPC ............. H01L 27/1266; H01L 27/1446; H01L 31/022466; H01L 31/022475;
(Continued)

(56) References Cited

U.S. PATENT DOCUMENTS

2003/0034542 A1* 2/2003 Okumura ................ B81C 3/001
257/508
2013/0126081 A1 5/2013 Hu et al.
(Continued)

FOREIGN PATENT DOCUMENTS

CA 2374598 C 5/2005
CN 107248518 A 10/2017
(Continued)

OTHER PUBLICATIONS

CN201910256479.8 OA1.

*Primary Examiner* — Herve-Louis Y Assouman
*Assistant Examiner* — Christopher M Roland
(74) *Attorney, Agent, or Firm* — IPro, PLLC

(57) ABSTRACT

Disclosed are an array substrate and a preparation method thereof, and a digital microfluidic chip. The preparation method includes: forming a plurality of photoelectric detection devices on a silicon-based substrate; transferring the photoelectric detection devices to a base substrate by adopting a micro transfer printing process; and forming a plurality of transparent driving electrodes on the base substrate, wherein the transparent driving electrodes are insulated from the photoelectric detection devices.

7 Claims, 18 Drawing Sheets

(51) Int. Cl.
*H01L 31/0224* (2006.01)
*B01L 3/00* (2006.01)

(52) U.S. Cl.
CPC .. *H01L 31/022466* (2013.01); *H01L 31/1884* (2013.01); *H01L 31/1896* (2013.01); *B01L 3/502707* (2013.01); *B01L 2200/12* (2013.01)

(58) Field of Classification Search
CPC ............. H01L 31/1876; H01L 31/1884; H01L 31/1896; B01L 3/502707; B01L 3/502784; B01L 2200/12
See application file for complete search history.

(56) References Cited

U.S. PATENT DOCUMENTS

| | | | | |
|---|---|---|---|---|
| 2013/0333094 | A1* | 12/2013 | Rogers | A61B 34/76 340/407.1 |
| 2014/0159066 | A1* | 6/2014 | Hu | H01L 24/75 438/28 |
| 2015/0008389 | A1 | 1/2015 | Hu et al. | |
| 2015/0132873 | A1 | 5/2015 | Rogers et al. | |
| 2015/0372187 | A1* | 12/2015 | Bower | H01L 25/50 438/110 |
| 2016/0268491 | A1* | 9/2016 | Wu | H01L 24/81 |
| 2018/0031974 | A1* | 2/2018 | Prevatte | H05K 3/305 |
| 2018/0138071 | A1* | 5/2018 | Bower | H01L 33/38 |
| 2019/0092623 | A1 | 3/2019 | Ding et al. | |
| 2019/0198543 | A1 | 6/2019 | Guo et al. | |
| 2020/0108387 | A1 | 4/2020 | Dong et al. | |

FOREIGN PATENT DOCUMENTS

| | | |
|---|---|---|
| CN | 107607475 A | 1/2018 |
| CN | 107649223 A | 2/2018 |
| CN | 107783331 A | 3/2018 |
| CN | 108899337 A | 11/2018 |
| CN | 109174219 A | 1/2019 |
| CN | 109873053 A | 6/2019 |
| WO | 2020006972 A1 | 1/2020 |

* cited by examiner

ARRAY SUBSTRATE AND PREPARATION METHOD THEREOF, AND DIGITAL MICROFLUIDIC CHIP

This application is a National Stage of International Application No. PCT/CN2020/080258, filed on Mar. 19, 2020, which claims priority of the Chinese Patent Application No. 201910256479.8, filed to the Patent Office of the People's Republic of China on Apr. 1, 2019 and entitled "ARRAY SUBSTRATE AND PREPARATION METHOD THEREOF, AND DIGITAL MICROFLUIDIC CHIP", the entire contents of which are incorporated herein by reference.

FIELD

The present disclosure relates to the technical field of trace detection and in particular to an array substrate and a preparation method thereof, and a digital microfluidic chip.

BACKGROUND

Generally, basic operations such as sample preparation, reaction, separation and detection in biological, chemical and medical analysis processes may be integrated on a detection chip with a relatively small size, such as a micro-sized digital microfluidic chip. Generally, optical detection is mainly adopted in a detection technology based on a digital microfluidic chip.

SUMMARY

An embodiment of the present disclosure provides a preparation method of an array substrate applied to a digital microfluidic chip, including:
  forming a plurality of photoelectric detection devices on a silicon-based substrate;
  transferring the photoelectric detection devices to a base substrate by adopting a micro transfer printing process; and
  forming a plurality of transparent driving electrodes on the base substrate, wherein the transparent driving electrodes are insulated from the photoelectric detection devices.

Optionally, in the embodiment of the present disclosure, the step of forming a plurality of transparent driving electrodes on the base substrate includes:
  forming the plurality of transparent driving electrodes at the sides, facing away from the base substrate, of the photoelectric detection devices after the photoelectric detection devices are transferred to the base substrate.

Optionally, in the embodiment of the present disclosure, the forming a plurality of photoelectric detection devices on a silicon-based substrate includes:
  forming a photoelectric conversion film layer and a first electrode layer on a first silicon-based substrate sequentially;
  patterning the first electrode layer to form patterns of a plurality of first electrodes;
  forming patterns of a plurality of conductive bonding layers on a second silicon-based substrate, wherein the plurality of conductive bonding layers respectively correspond to the first electrodes;
  aligning and bonding the side, provided with the first electrodes, of the first silicon-based substrate and the side provided with the conductive bonding layers, of the second silicon-based substrate, and removing the first silicon-based substrate; and
  patterning the photoelectric conversion film layer to form a plurality of photoelectric conversion units.

Optionally, in the embodiment of the present disclosure, before the transferring the photoelectric detection devices to the base substrate, the preparation method further includes:
  forming detection signal lines respectively corresponding to the photoelectric detection devices on the base substrate.

Optionally, in the embodiment of the present disclosure, the transferring the photoelectric detection devices to the base substrate includes:
  picking up the photoelectric detection devices located on the second silicon-based substrate; and
  transferring the photoelectric detection devices to the surface of the side provided with the detection signal lines, of the base substrate, and connecting the first electrodes of the photoelectric detection devices to the corresponding detection signal lines electrically.

Optionally, in the embodiment of the present disclosure, after the transferring the photoelectric detection devices to the base substrate and before the forming the plurality of transparent driving electrodes on the base substrate, the preparation method further includes:
  forming a first planarization layer on a film layer on which the photoelectric detection devices are located, and patterning the first planarization layer to expose the photoelectric detection devices; and
  forming a common transparent electrode layer on the first planarization layer, and connecting the common transparent electrode layer to the photoelectric detection devices electrically.

Optionally, in the embodiment of the present disclosure, after the forming the common transparent electrode layer on the first planarization layer and before the forming the plurality of transparent driving electrodes, the preparation method further includes:
  forming a second planarization layer on the common transparent electrode layer; and
  the forming the plurality of transparent driving electrodes at the sides facing away from the base substrate, of the photoelectric detection devices includes:
  forming a transparent driving electrode layer on the second planarization layer, and patterning the transparent driving electrode layer to form the transparent driving electrodes.

Optionally, in the embodiment of the present disclosure, the forming a plurality of transparent driving electrodes on the base substrate includes:
  forming the plurality of transparent driving electrodes at the side facing away from the photoelectric detection devices, of the base substrate.

Optionally, in the embodiment of the present disclosure, the forming a plurality of photoelectric detection devices on a silicon-based substrate includes:
  forming photoelectric conversion film layers and a first electrode layer on a third silicon-based substrate sequentially; and
  patterning the first electrode layer to form patterns of a plurality of first electrodes, and patterning the photoelectric conversion film layers to form a plurality of photoelectric conversion units.

Optionally, in the embodiment of the present disclosure, before the transferring the photoelectric detection devices to the base substrate, the preparation method further includes:

forming a common transparent electrode layer at one side of the base substrate, wherein the common transparent electrode layer and the transparent driving electrodes are located at different sides of the base substrate.

Optionally, in the embodiment of the present disclosure, the transferring the photoelectric detection devices to the base substrate includes:

picking up the photoelectric detection devices located on the third silicon-based substrate; and transferring the photoelectric detection devices to a surface provided with the common transparent electrode layer, of the base substrate, and connecting the photoelectric conversion units of the photoelectric detection devices to the common transparent electrode layer electrically.

Optionally, in the embodiment of the present disclosure, after the transferring the photoelectric detection devices to the base substrate, the preparation method further includes:

forming a first planarization layer on a film layer on which the photoelectric detection devices are located, and patterning the first planarization layer to expose the photoelectric detection devices; and forming detection signal lines respectively corresponding to the photoelectric detection devices on the first planarization layer, and connecting the photoelectric detection devices to the corresponding detection signal lines electrically.

Optionally, in the embodiment of the present disclosure, the preparation method further includes:

forming a protective layer on the detection signal lines.

Accordingly, an embodiment of the present disclosure provides an array substrate prepared by using the above-mentioned preparation method.

Accordingly, an embodiment of the present disclosure provides a digital microfluidic chip including the above-mentioned array substrate.

DETAILED DESCRIPTION OF THE EMBODIMENTS

Figure 1:
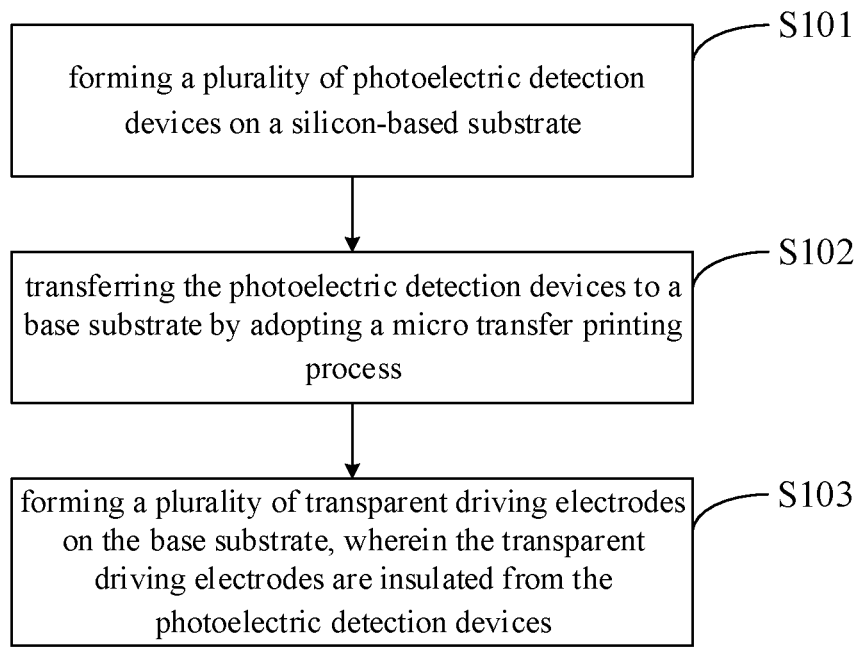
FIG. 1 is a first flowchart of a preparation method according to an embodiment of the present disclosure.

In order to make the purpose, technical solutions and advantages of the present disclosure clearer, specific implementations of an array substrate and a preparation method thereof, and a digital microfluidic chip provided by embodiments of the present disclosure are described in detail below in conjunction with accompanying drawings. It should be understood that preferred embodiments described below are only intended to illustrate and explain the present disclosure, rather than to limit the present disclosure. In addition, embodiments in the present disclosure and features in the embodiments may be combined with each other without conflicts. It should be noted that sizes and shapes of all patterns in the accompanying drawings do not reflect real scales, and are merely to illustrate the contents of the present disclosure. Furthermore, same or similar numerals throughout indicate same or similar elements or elements with same or similar functions.

A digital microfluidic technology refers to a microfluidic technology for controlling a discrete droplet and includes two parts of droplet production and droplet operation. The part of droplet production takes charge of producing trace droplets with sizes ranging from nanoscales to microscales within very short time. The droplet operation includes basic treatment such as production, transportation, mixing and separation, and different operations on a plurality of droplets can be realized at the same time by using the digital microfluidic technology, so that large-scale concurrent treatment and detection analysis for the droplets are realized in a chip laboratory, and the work efficiency is greatly increased. Moreover, by using the digital microfluidic technology, basic operation units for sample preparation, reaction, separation, detection and the like in biological, chemical and medical analysis processes can be integrated on a micrometer-scale chip (such as a microsized digital microfluidic chip), and the overall process of analysis can be automatically completed. The digital microfluidic technology can reduce the cost and has the advantages such as short detection time and high sensitivity so as to have shown a huge prospect in fields such as biology, chemistries and medicines.

A photoelectric detection device has the advantages such as high precision, high response speed and simple structure and is very widely applied to detection. An ordinary photoelectric detection device receives light and converts a light signal into an electric signal by virtue of a photovoltaic effect, and a detection function is achieved by the reading of a driving chip (Integrated Circuit, IC), in this way, an optical detection function can be integrated in a digital microfluidic chip, and thus, a detection device is miniaturized. However, at present, a photoelectric detection device prepared from a glass substrate is poor in performance and relatively poor in signal quality due to the precision problem of a glass process.

Based on the above, embodiments of the present disclosure provide an array substrate and a preparation method thereof, and a digital microfluidic chip. The array substrate is applied to the digital microfluidic chip.

Figure 2:
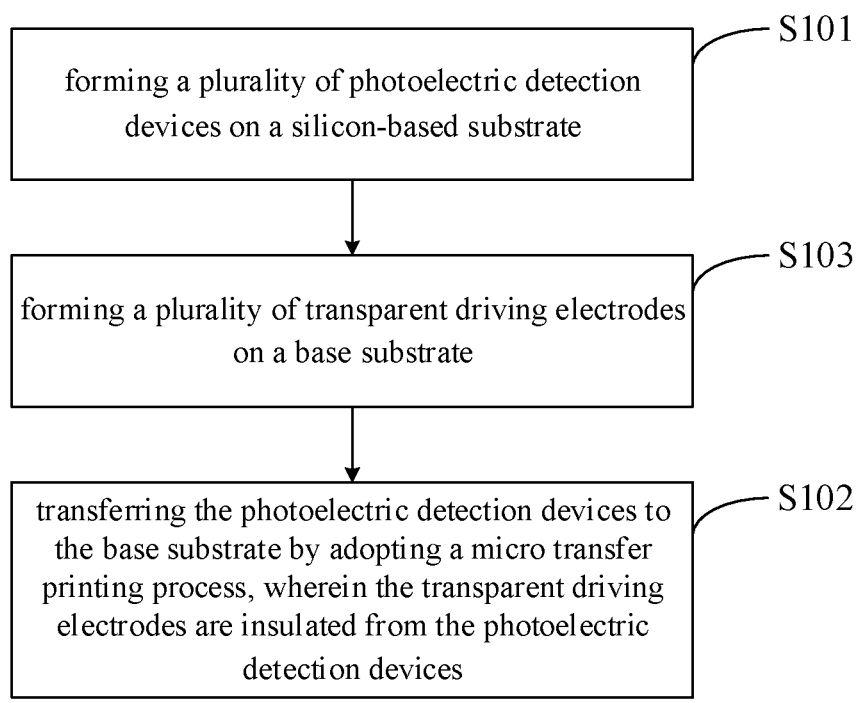
FIG. 2 is a second flowchart of a preparation method according to an embodiment of the present disclosure.

The preparation method of the array substrate applied to the digital microfluidic chip, provided by the embodiment of the present disclosure, as shown in FIG. 1 and FIG. 2, may include:

S101, forming a plurality of photoelectric detection devices on a silicon-based substrate;

S102, transferring the photoelectric detection devices to a base substrate by adopting a micro transfer printing process; and S103, forming a plurality of transparent driving electrodes on the base substrate, wherein the transparent driving electrodes are insulated from the photoelectric detection devices.

The above-mentioned step S103 may be performed before or after the above-mentioned step S102 is performed; as shown in FIG. 1, S103 is performed after S102; and as shown in FIG. 2, S103 is performed before S102.

According to the preparation method of the array substrate, provided by the embodiments of the present disclosure, the photoelectric detection devices are formed on the silicon-based substrate, and are transferred to the base substrate by adopting the micro transfer printing process, and the photoelectric detection devices prepared by using a silicon-based process have excellent device performances, so that the problem of poor photoelectric characteristics of the photoelectric detection devices directly prepared from a glass substrate can be solved, and furthermore, the performances of the formed photoelectric detection devices are improved.

During specific implementation, the above-mentioned base substrate may be a glass substrate or a substrate made of other materials, and is not limited herein.

Optionally, the above-mentioned photoelectric detection devices may be photodiodes or other photoelectric detection devices, and are not limited herein.

The present disclosure will be described in detail below in conjunction with specific embodiments and the accompanying drawings. It should be noted that the present embodiment is merely intended to better explain the present disclosure, rather than to limit the present disclosure.

In some embodiments, in the above-mentioned array substrate in the embodiment of the present disclosure, the transparent driving electrodes and the photoelectric detection devices are located at the same side of the base substrate, and the preparation method of the array substrate with such a structure will be described in detail below in conjunction with the accompanying drawings.

Optionally, in the above-mentioned preparation method provided by the embodiment of the present disclosure, the above-mentioned step S103 may include:

after the photoelectric detection devices are transferred to the base substrate, the plurality of transparent driving electrodes are formed at the sides, facing away from the base substrate, of the photoelectric detection devices, that is, in the formed array substrate, the transparent driving electrodes and the photoelectric detection devices are located at the same side of the base substrate.

In some embodiments of the present disclosure, the above-mentioned step S101 of forming a plurality of photoelectric detection devices on a silicon-based substrate may specifically include: forming a plurality of photoelectric conversion units and a plurality of first electrodes sequentially on a silicon-based substrate, wherein the photoelectric conversion units may include polycrystalline silicon layers and silicon dioxide layers. Moreover, in the embodiment of the present disclosure, the first electrodes belonging to different photoelectric detection devices are insulated from each other, and photoelectric conversion layers belonging to different photoelectric detection devices are insulated from each other.

Figure 3A:
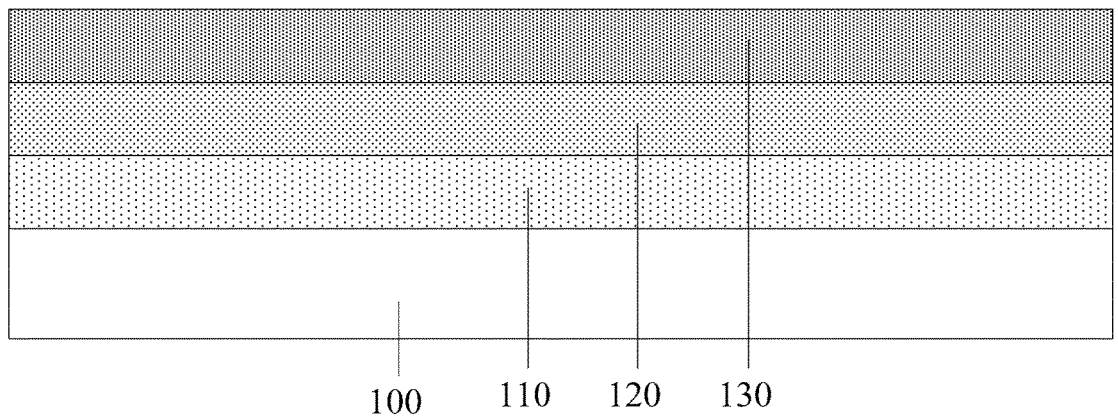
FIG. 3A to FIG. 3L are respectively section-view structural schematic diagrams corresponding to steps performed in embodiments of the present disclosure.

In some embodiments, the above-mentioned step S101 may specifically include the following steps:

referring to FIG. 3A, photoelectric conversion film layers and a first electrode layer 130 are sequentially formed on a first silicon-based substrate 100, wherein the photoelectric conversion film layers may include a polycrystalline silicon film layer 110 and a silicon dioxide film layer 120.

Figure 3B:
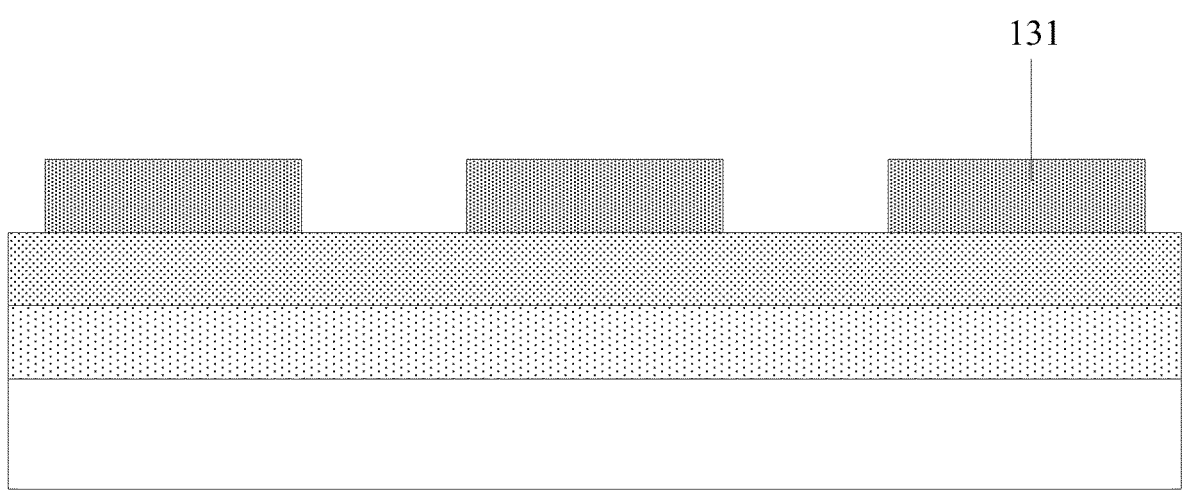

Referring to FIG. 3B, the first electrode layer 130 is patterned to form patterns of a plurality of first electrodes 131, for example, the first electrode layer 130 may be patterned by adopting photolithography.

Figure 3C:
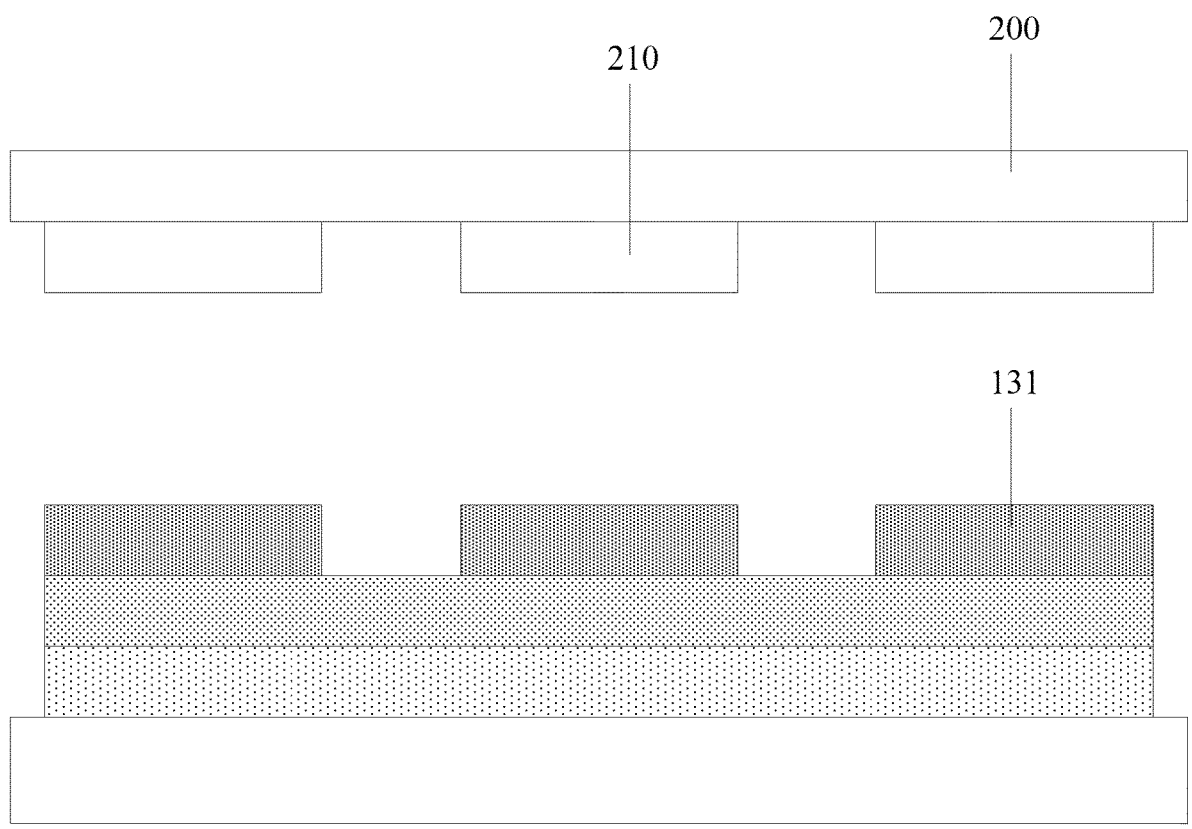

Referring to FIG. 3C, patterns of a plurality of conductive bonding layers 210 are formed on a second silicon-based substrate 200, wherein the plurality of conductive bonding layers 210 respectively correspond to the first electrodes 131.

Figure 3D:
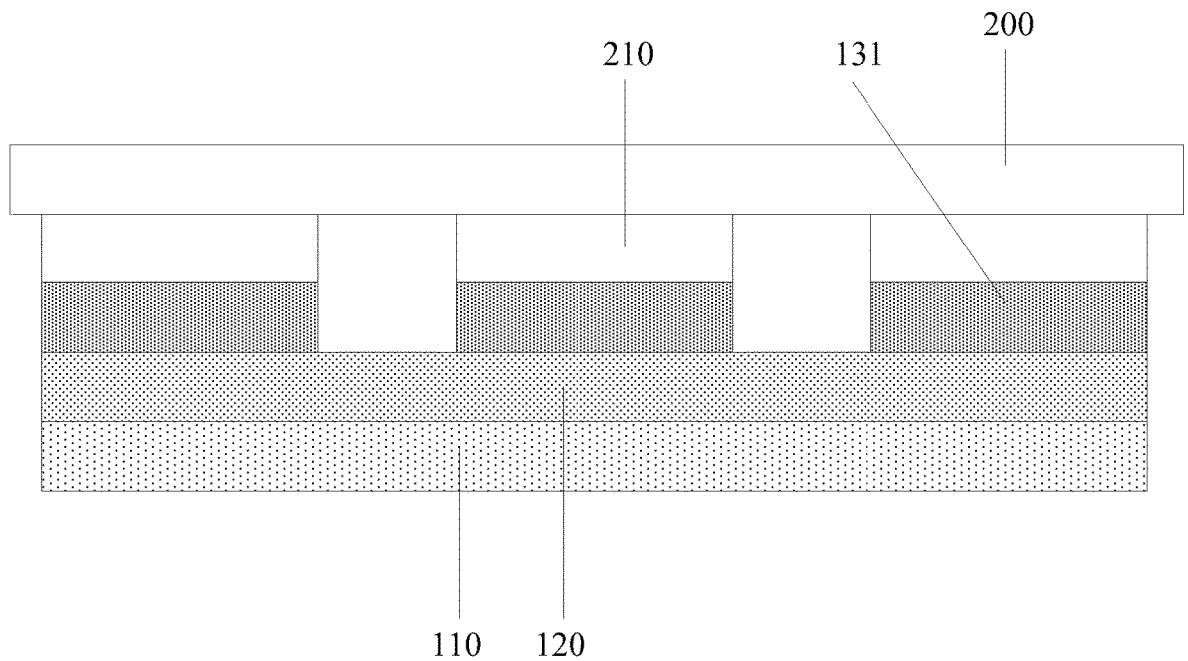

As shown in FIG. 3C, the side, provided with the first electrodes 131, of the first silicon-based substrate 100 and the side, provided with the conductive bonding layers 210, of the second silicon-based substrate 200 are aligned and bonded, and then, the first silicon-based substrate is removed, so that a structure as shown in FIG. 3D is obtained. Optionally, in the process that the first silicon-based substrate is aligned with the second silicon-based substrate, as shown in FIG. 3C, it is possible that the second silicon-based substrate 200 is disposed on the first silicon-based substrate 100, or the first silicon-based substrate is disposed on the second silicon-based substrate, there are no limitations herein. It should be noted that new first electrodes 131 are formed after the conductive bonding layers 210 are bonded with the corresponding first electrodes 131, and therefore, the conductive bonding layers are omitted in subsequent FIG. 3G to FIG. 3L.

Figure 3E:
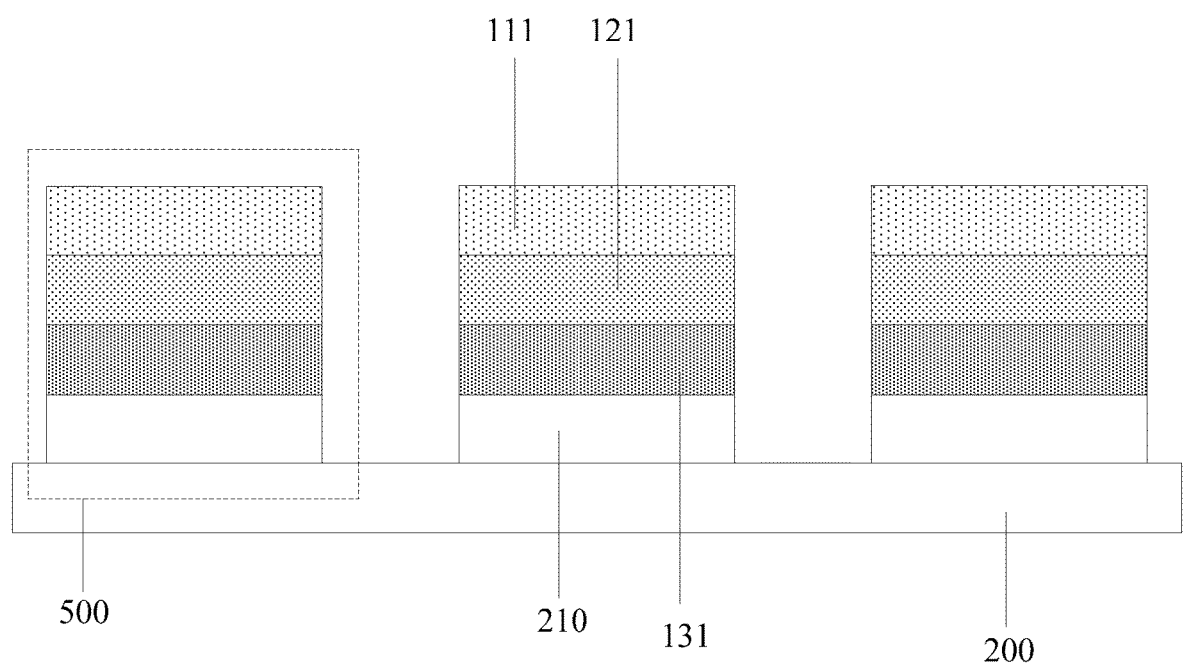

Referring to FIG. 3E, the photoelectric conversion film layers 110 and 120 are patterned to form a plurality of photoelectric conversion units, that is, polycrystalline silicon layers 111 and silicon dioxide layers 121 in FIG. 3E, so that photoelectric detection devices 500 are obtained. Optionally, the photoelectric conversion film layers may be patterned by adopting photolithography.

Figure 3F:
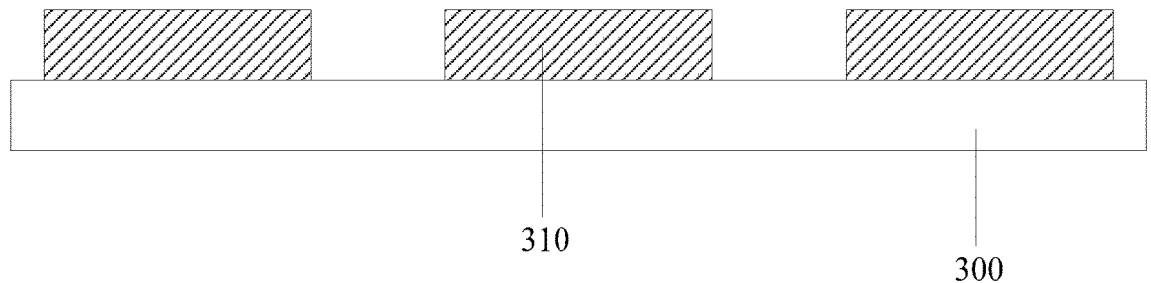

During actual application, in the above-mentioned preparation method provided by the embodiment of the present disclosure, before the above-mentioned step S102 is performed, the preparation method may further include:

referring to FIG. 3F, detection signal lines 310 respectively corresponding to the photoelectric detection devices are formed on a base substrate 300.

Figure 3G:
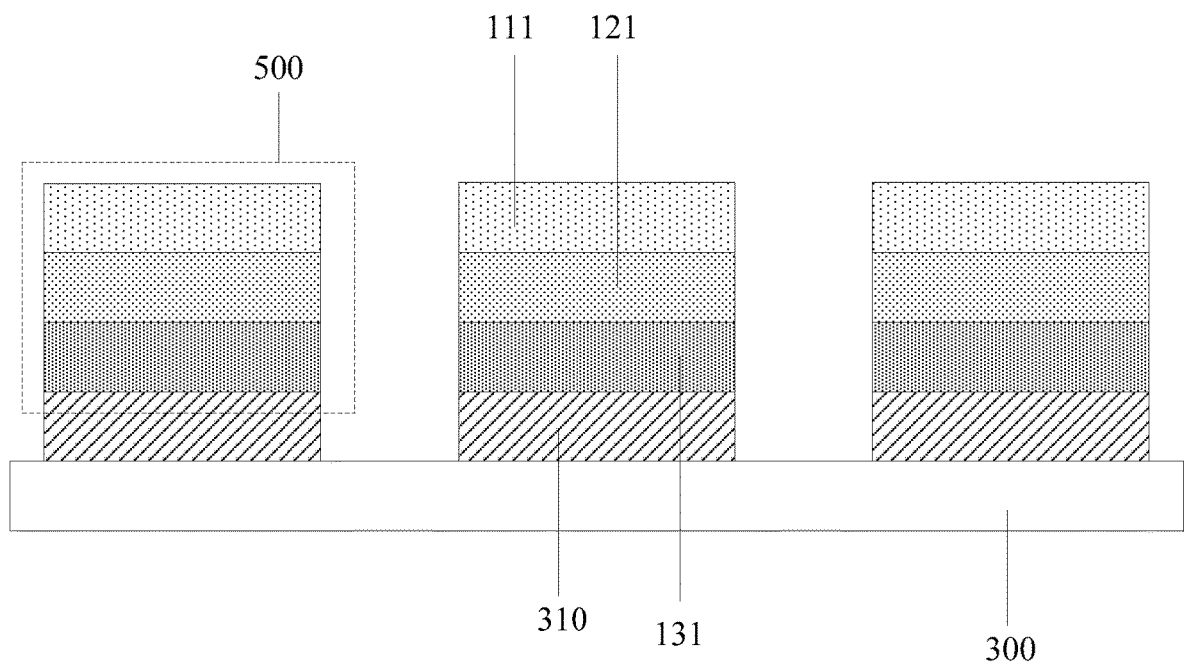

In some embodiments, the above-mentioned step S102 may specifically include:

the photoelectric detection devices 500 located on the second silicon-based substrate are picked up, referring to FIG. 3E, a transfer substrate may be adopted to pick up the first electrodes 131, the polycrystalline silicon layers 111 and the silicon dioxide layers 121 located on the second silicon-based substrate 200; and referring to FIG. 3G, the photoelectric detection devices 500 are transferred to the surface of the side, provided with the detection signal lines 310, of the base substrate 300, and the first electrodes 131 of the photoelectric detection devices 500 are electrically connected to the corresponding detection signal lines 310.

Figure 3H:
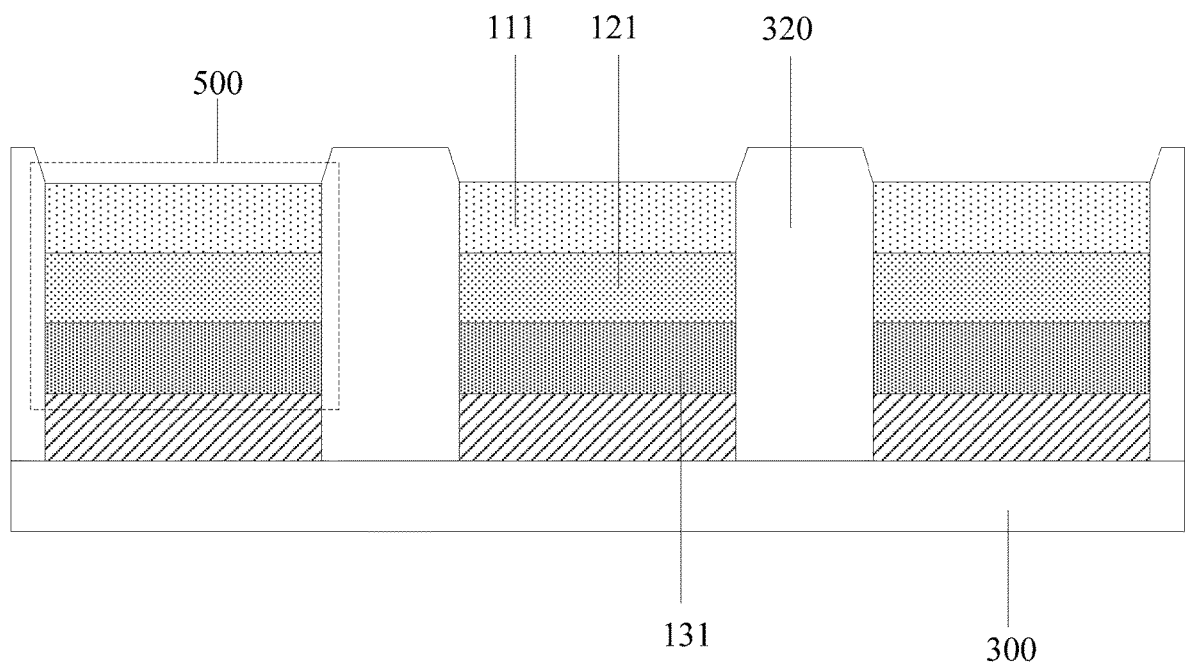

Optionally, in the above-mentioned preparation method provided by the embodiment of the present disclosure, after the above-mentioned step S102 is performed and before the above-mentioned step S103 is performed, the preparation method may further include:

referring to FIG. 3H, a first planarization layer 320 is formed on a film layer on which the photoelectric detection devices 500 are located, that is, the first planarization layer 320 is formed on the base substrate 300 on which the first electrodes 131, the polycrystalline silicon layers 111 and the silicon dioxide layers 121 of the plurality of photoelectric detection devices 500 are formed, and the first planarization layer 320 is patterned to expose the photoelectric detection devices 500. Specifically, an orthographic projection of the first planarization layer 320 on the base substrate 300 is not overlapped with orthographic projections of the photoelectric detection devices 500 on the base substrate 300; or, the orthographic projection of the first planarization layer 320 on the base substrate 300 is partially overlapped with the orthographic projections of the photoelectric detection devices 500 on the base substrate 300.

Figure 3I:
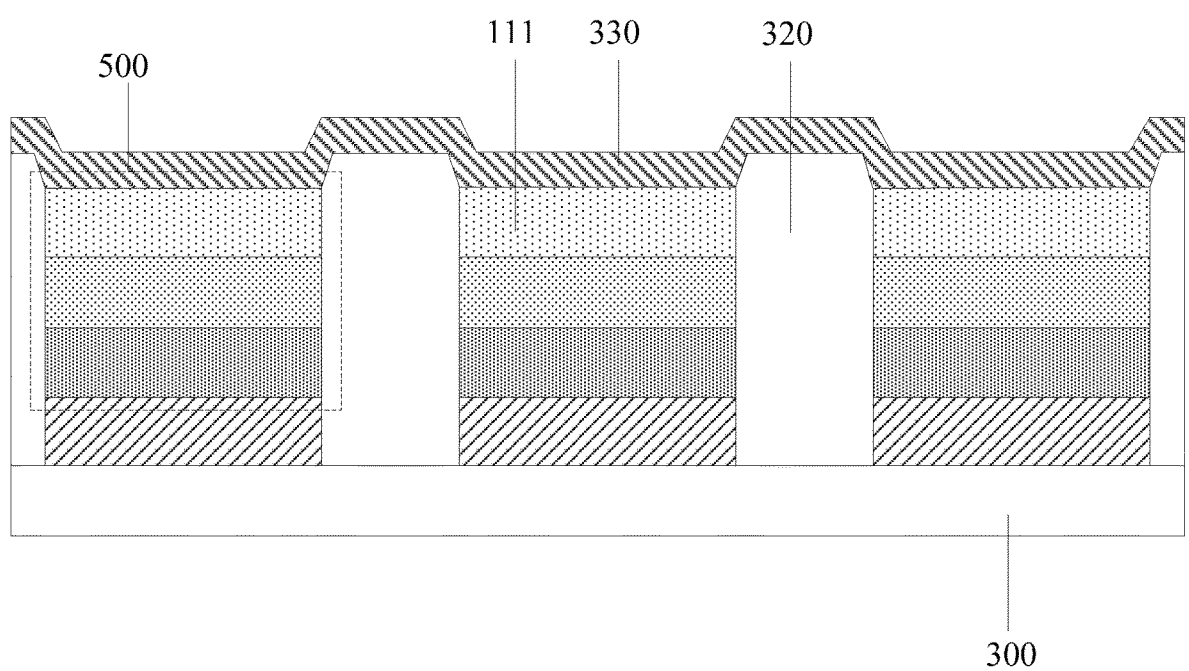

Referring to FIG. 3I, a common transparent electrode layer 330 is formed on the first planarization layer 320, and the common transparent electrode layer 330 is electrically connected to the photoelectric detection devices 500. During specific implementation, the above-mentioned common transparent electrode layer may be electrically connected to cathodes of the photoelectric detection devices, and the above-mentioned first electrodes may be electrically connected to anodes of the photoelectric detection devices.

Figure 3J:
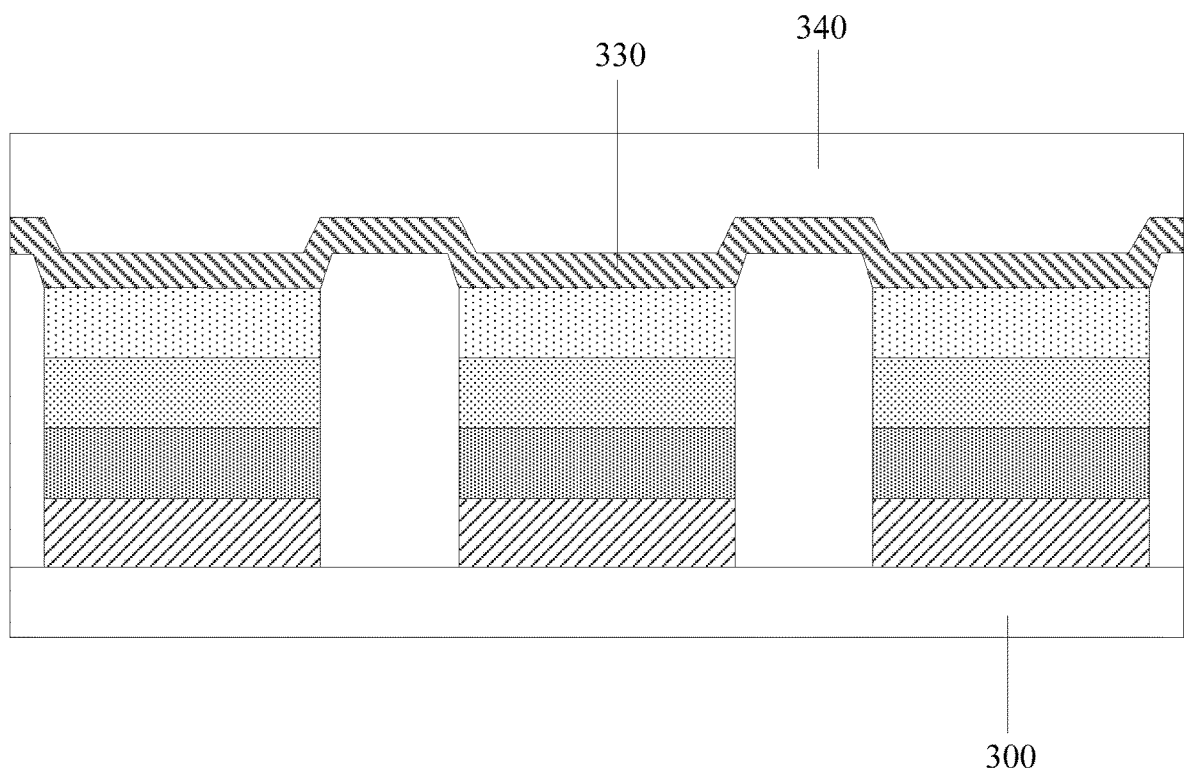

In some embodiments, after the common transparent electrode layer is formed on the first planarization layer and before the plurality of transparent driving electrodes are formed, the preparation method may further include:

referring to FIG. 3J, a second planarization layer 340 is formed on the common transparent electrode layer.

Figure 3K:
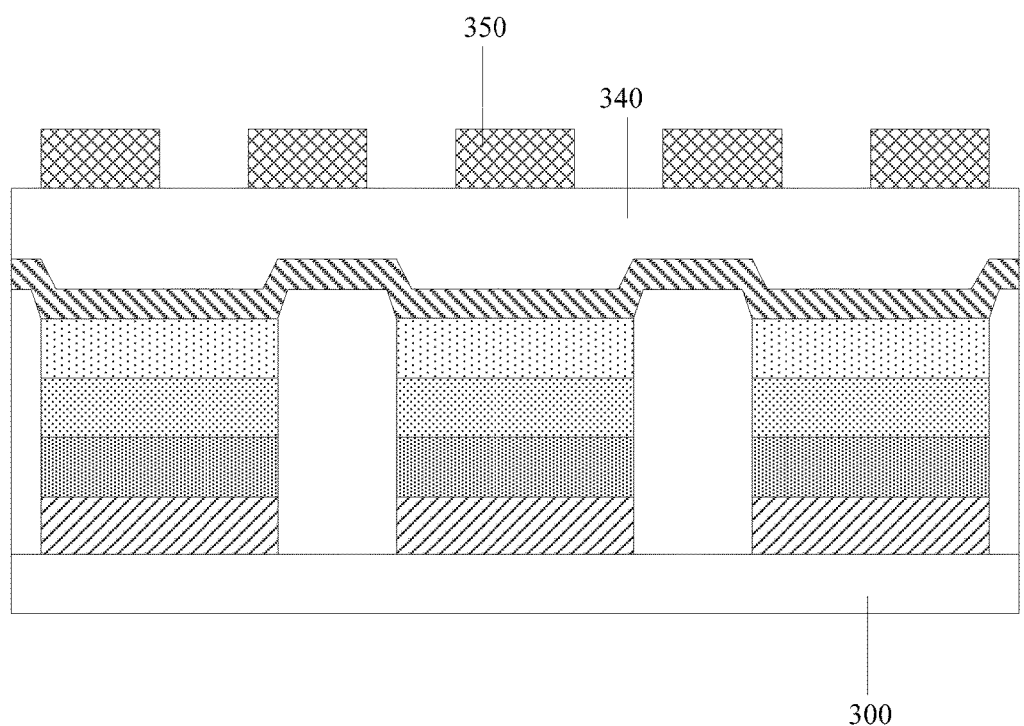

The above-mentioned step of forming the plurality of transparent driving electrodes at the sides, facing away from the base substrate, of the photoelectric detection devices may specifically include:

referring to FIG. 3K, a transparent driving electrode layer is formed on the second planarization layer 340, and the transparent driving electrode layer is patterned to form the transparent driving electrodes 350.

In some embodiments, while patterns of the plurality of transparent driving electrodes are formed, the preparation method may further include: forming patterns of transparent driving electrode traces electrically connected to the transparent driving electrodes. Of course, it is possible that the patterns of the transparent driving electrode traces electrically connected to the transparent driving electrodes are formed after the patterns of the plurality of transparent driving electrodes are formed, there are no limitations herein.

Figure 3L:
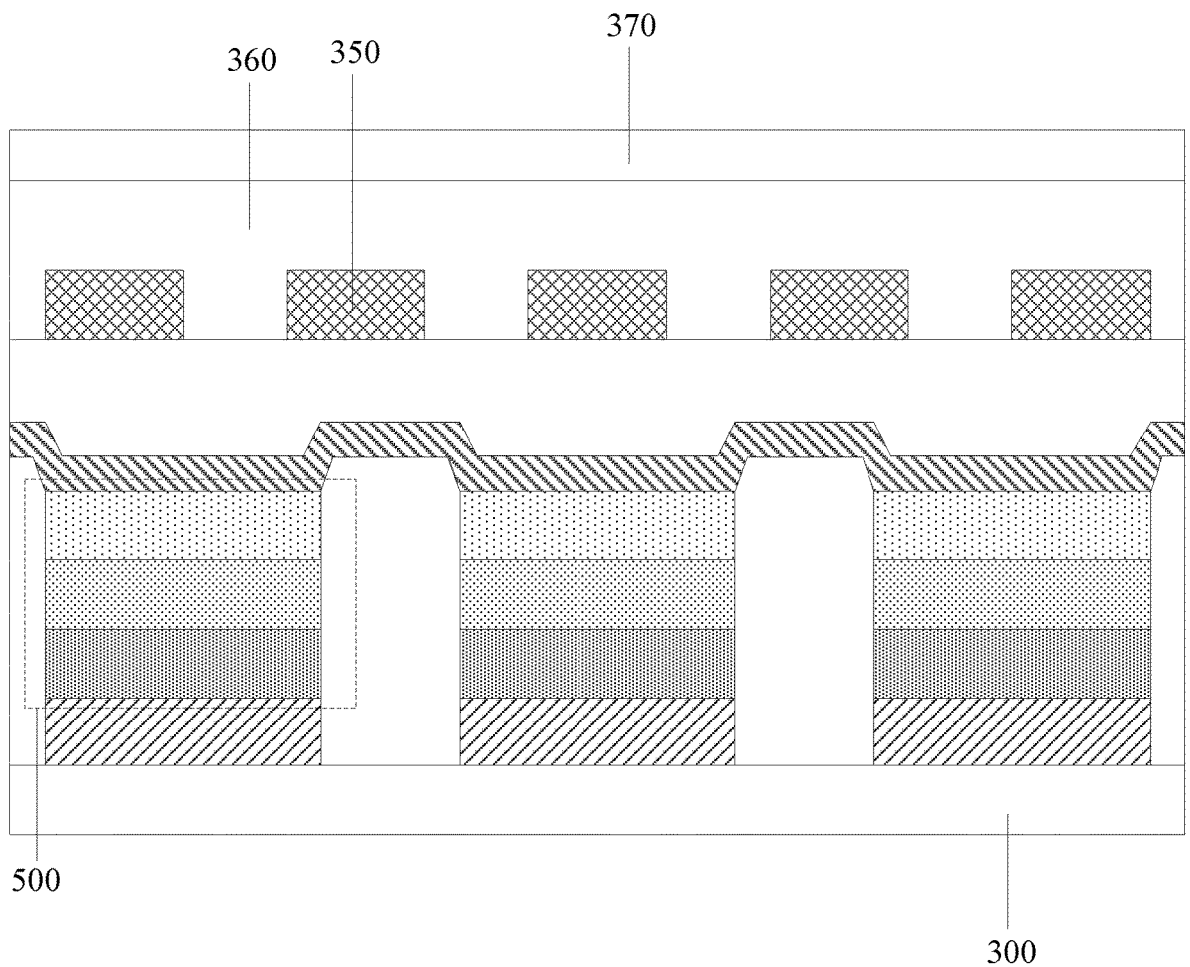

Further, in some embodiments, after the patterns of the plurality of transparent driving electrodes are formed, the preparation method may further include:

referring to FIG. 3L, a first dielectric layer 360 is formed on the transparent driving electrodes 350.

Further, in some embodiments, after the first dielectric layer is formed, the preparation method may further include:

referring to FIG. 3L as well, a first lyophobic layer 370 is formed on the first dielectric layer 360.

In some embodiments, the common transparent electrodes may be made of a material including an indium tin oxide (ITO) material, an indium zinc oxide (IZO) material, carbon nanotubes or graphene and the like.

In some embodiments, the detection signal lines may be made of a material including a transparent conductive material such as ITO, IZO, carbon nanotubes or graphene. Or, the detection signal lines may be made of a material including a non-transparent conductive material such as Al, Mo and Cu.

In some embodiments, the first electrodes may be made of a material including low-melting-point metals such as Sn and In. In this way, the first electrodes and the detection signal lines formed on the base substrate may be favorably subjected to metal fusion bonding.

In some embodiments, the first planarization layer may be made of a material including SiO2, SiN, PI (Polyimide), PMMA, resin and the like.

In some embodiments, the second planarization layer may be made of a material including SiO2, SiN, PI (Polyimide), PMMA, resin and the like.

In some embodiments, the transparent driving electrodes may be made of a material including an indium tin oxide (ITO) material, an indium zinc oxide (IZO) material, carbon nanotubes or graphene and the like.

The preparation method of the array substrate, provided by the embodiment of the present disclosure, will be described below with specific embodiments, but a reader should know that the specific process is not limited herein.

The preparation method of the array substrate, provided by the embodiment of the present disclosure, may include the following steps.

(1) A polycrystalline silicon film layer 110, a silicon dioxide film layer 120 and a first electrode layer 130 are sequentially deposited on a first silicon-based substrate 100, as shown in FIG. 3A.

(2) The first electrode layer 130 is patterned by adopting photolithography to form patterns of a plurality of independent first electrodes 131, as shown in FIG. 3B.

(3) Patterns of a plurality of conductive bonding layers 210 are formed on a second silicon-based substrate 200, wherein the plurality of conductive bonding layers 210 respectively correspond to the first electrodes 131, as shown in FIG. 3C, and therefore, subsequently each conductive bonding layer 210 can be bonded with the corresponding first electrode 131.

(4) The first electrodes 131 on the first silicon-based substrate 100 and the conductive bonding layers 210 on the second silicon-based substrate 200 are aligned and bonded, the conductive bonding layers 210 are bonded with the corresponding first electrodes 131, and the first silicon-based substrate is removed by adopting an etching process, as shown in FIG. 3D. In this way, the first electrodes 131, the silicon dioxide film layer 120 and the polycrystalline silicon film layer 110 can be formed on the second silicon-based substrate 200. Moreover, the conductive bonding layers 210 and the corresponding first electrodes 131 which are bonded are used as new first electrodes 131. It should be noted that FIG. 3G to FIG. 3L only show the first electrodes 131.

(5) The polycrystalline silicon film layer and the silicon dioxide film layer are patterned by adopting photolithography to form polycrystalline silicon layers 111 and silicon dioxide layers 121 in photoelectric conversion layers, as shown in FIG. 3E. In the same photoelectric detection device 500, an orthographic projection of the polycrystalline silicon layer 111 on the second silicon-based substrate 200 can be located in an orthographic projection of the first electrode 131 on the second silicon-based substrate 200. Moreover, in the same photoelectric detection device, an orthographic projection of the silicon dioxide layer 121 on the second silicon-based substrate 200 can be located in the orthographic projection of the first electrode 131 on the second silicon-based substrate 200. In addition, the first electrodes 131 are located between the second silicon-based substrate 200 and the silicon dioxide layers 121.

(6) Patterns of detection signal lines 310 in one-to-one correspondence to the photoelectric detection devices 500 are formed on a base substrate 300, as shown in FIG. 3F. Specifically, the above-mentioned base substrate 300 may be a glass substrate or a substrate made of other materials, but is not limited herein.

(7) The plurality of photoelectric detection devices 500 are transfer-printed to the base substrate 300 by a transfer substrate by adopting a micro transfer printing process, that is, the first electrodes 131, the polycrystalline silicon layers 111 and the silicon dioxide layers 121 are transfer-printed to the base substrate 300, and the first electrodes 131 are electrically connected to the corresponding detection signal lines 310. As shown in FIG. 3G, the first electrodes 131 are formed between the silicon dioxide layers 121 and the base substrate 300, and the polycrystalline silicon layers 111 are located at the sides, facing away from the base substrate 300, of the silicon dioxide layers 121.

(8) A first planarization layer 320 is formed on the base substrate 300 on which the first electrodes 131, the polycrystalline silicon layers 111 and the silicon dioxide layers 121 of the plurality of photoelectric detection devices 500 are formed, and the first planarization layer 320 is patterned to expose the photoelectric detection devices 500. As shown in FIG. 3H, an orthographic projection of the first planarization layer 320 on the base substrate 300 is not overlapped with orthographic projections of the photoelectric detection devices 500 on the base substrate 300; or, the orthographic projection of the first planarization layer 320 on the base substrate 300 is partially overlapped with the orthographic projections of the photoelectric detection devices 500 on the base substrate 300.

(9) A common transparent electrode layer 330 is formed on the base substrate 300 on which the first planarization layer 320 is formed, and the polycrystalline silicon layers 111 are electrically connected to the common transparent electrode layer 330, as shown in FIG. 3I.

(10) A second planarization layer 340 is formed on the common transparent electrode layer 330, as shown in FIG. 3J.

(11) Patterns of the transparent driving electrodes 350 and patterns of transparent driving electrode traces (not shown in the figure) electrically connected to the transparent driving electrodes 350 are formed at the side, facing away from the base substrate 300, of the second planarization layer 340, as shown in FIG. 3K.

(12) A first dielectric layer 360 and a first lyophobic layer 370 are sequentially formed on the transparent driving electrodes 350, as shown in FIG. 3L.

It should be noted that step (6) may be performed before steps (1)-(5) are performed; or step (6) may be performed after steps (1)-(5) are performed. Of course, step (6) may be performed while steps (1)-(5) are performed, there are no limitations herein.

In some another embodiments, in the array substrate provided by the embodiment of the present disclosure, the transparent driving electrodes and the photoelectric detection devices are located at different sides of the base substrate, and the preparation method of the array substrate with such a structure will be described in detail below in conjunction with the accompanying drawings.

In the above-mentioned preparation method provided by the embodiment of the present disclosure, the above-mentioned step S103 may specifically include:
the plurality of transparent driving electrodes are formed at the side, facing away from the photoelectric detection devices, of the base substrate, that is, the transparent driving electrodes and the photoelectric detection devices are located at different sides of the base substrate. During specific implementation, it is possible that the transparent driving electrodes are formed at one side of the base substrate firstly, the base substrate is overturned, and then, the photoelectric detection devices are transferred to the other side of the base substrate; or, the photoelectric detection devices are transferred to one side of the base substrate firstly, the base substrate is overturned, and then, the transparent driving electrodes are formed at the other side of the base substrate. The order of fabricating the transparent driving electrodes and the photoelectric detection devices is not limited herein.

Figure 4A:
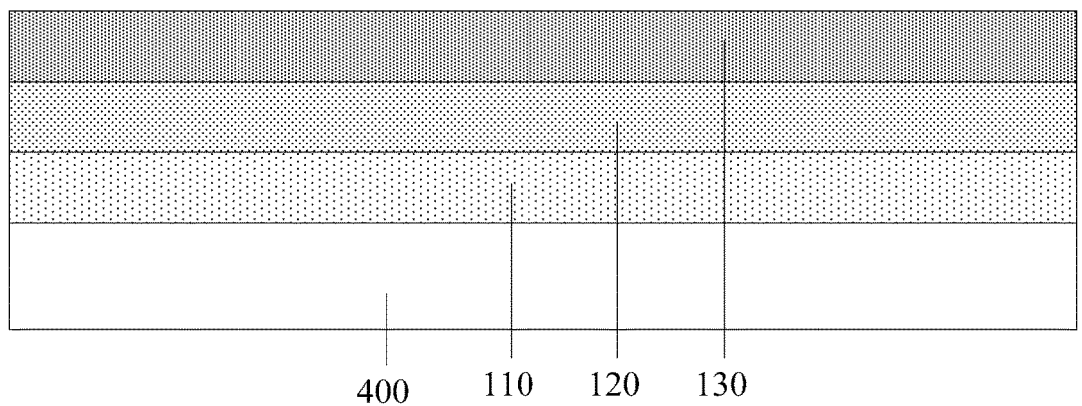
FIG. 4A to FIG. 4H are respectively section-view structural schematic diagrams corresponding to steps performed in embodiments of the present disclosure.

In some embodiments, the above-mentioned step S101 of forming a plurality of photoelectric detection devices on a silicon-based substrate may specifically include the following steps:
referring to FIG. 4A, photoelectric conversion film layers and a first electrode layer 130 are sequentially formed on a third silicon-based substrate 400, wherein the photoelectric conversion film layers may include a polycrystalline silicon film layer 110 and a silicon dioxide film layer 120.

Figure 4B:
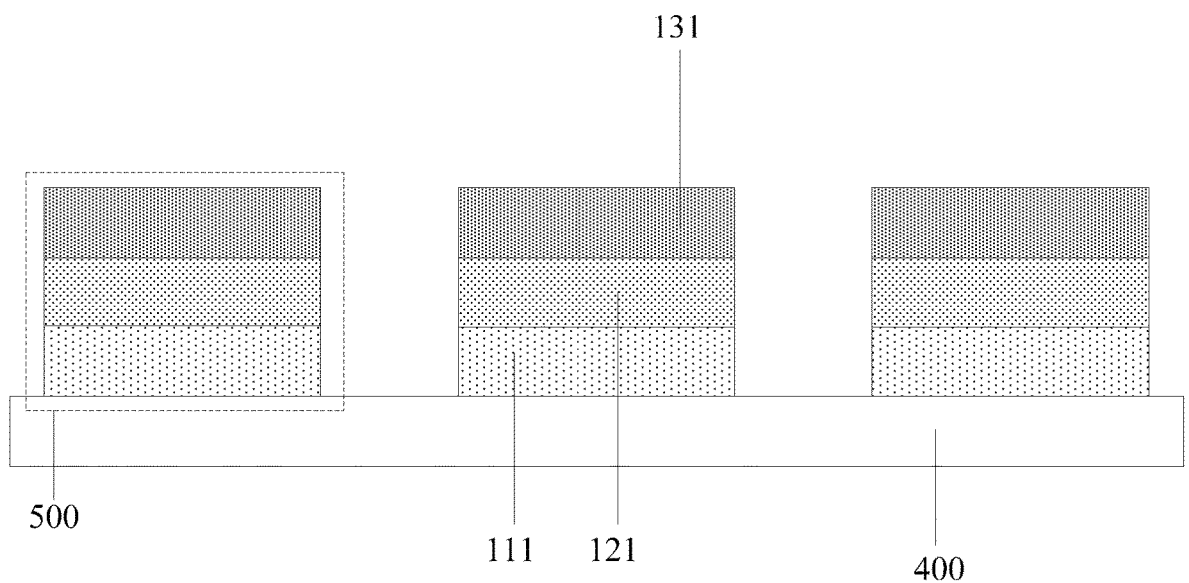

Meanwhile, referring to FIG. 4B, the first electrode layer 130 is patterned to form patterns of a plurality of first electrodes 131, and the photoelectric conversion film layers 110 and 120 are patterned to form a plurality of photoelectric conversion units, wherein the photoelectric conversion units may include polycrystalline silicon layers 111 and silicon dioxide layers 121. Specifically, the first electrode layer 130, the polycrystalline silicon film layer 110 and the silicon dioxide film layer 120 may be respectively patterned by adopting photolithography.

Figure 4C:
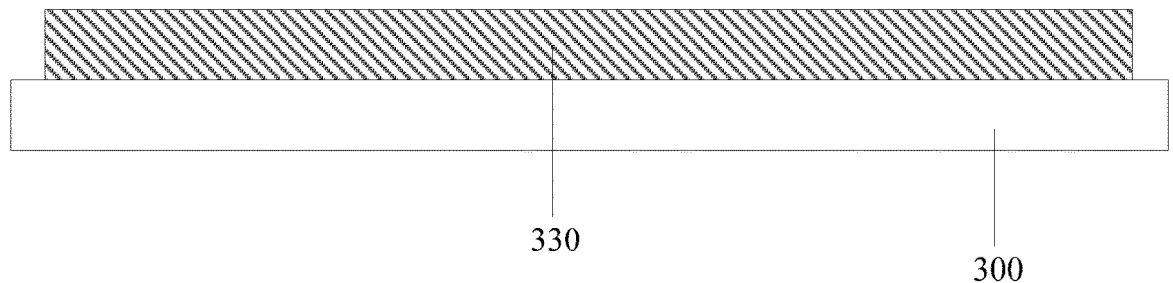

In some embodiments, before the above-mentioned step S102 is performed, the preparation method may further include:
referring to FIG. 4C, a common transparent electrode layer 330 is formed at one side of the base substrate 300; and the common transparent electrode layer 330 and the transparent driving electrodes are located at different sides of the base substrate.

Figure 4D:
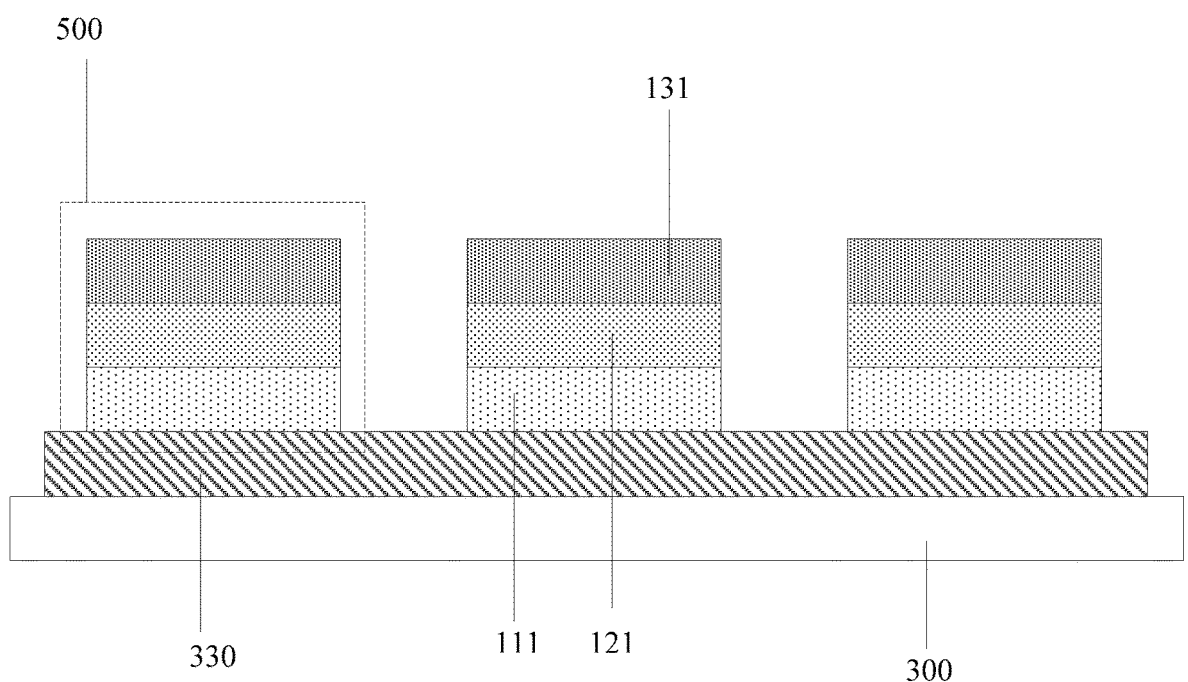

In the above-mentioned preparation method provided by the embodiment of the present disclosure, the above-mentioned step S102 may include:
the photoelectric detection devices 500 located on the third silicon-based substrate are picked up, the photoelectric detection devices 500 are transferred to the surface of the side, provided with the common transparent electrode layer 330, of the base substrate 300, and the photoelectric conversion units of the photoelectric detection devices 500 are electrically connected to the common transparent electrode layer 330, as shown in FIG. 4D. Optionally, a transfer substrate may be adopted to transfer the photoelectric detection devices 500 to the base substrate 300, and the polycrystalline silicon layers 111 in the photoelectric detection devices 500 are electrically connected to the common transparent electrode layer 330.

Figure 4E:
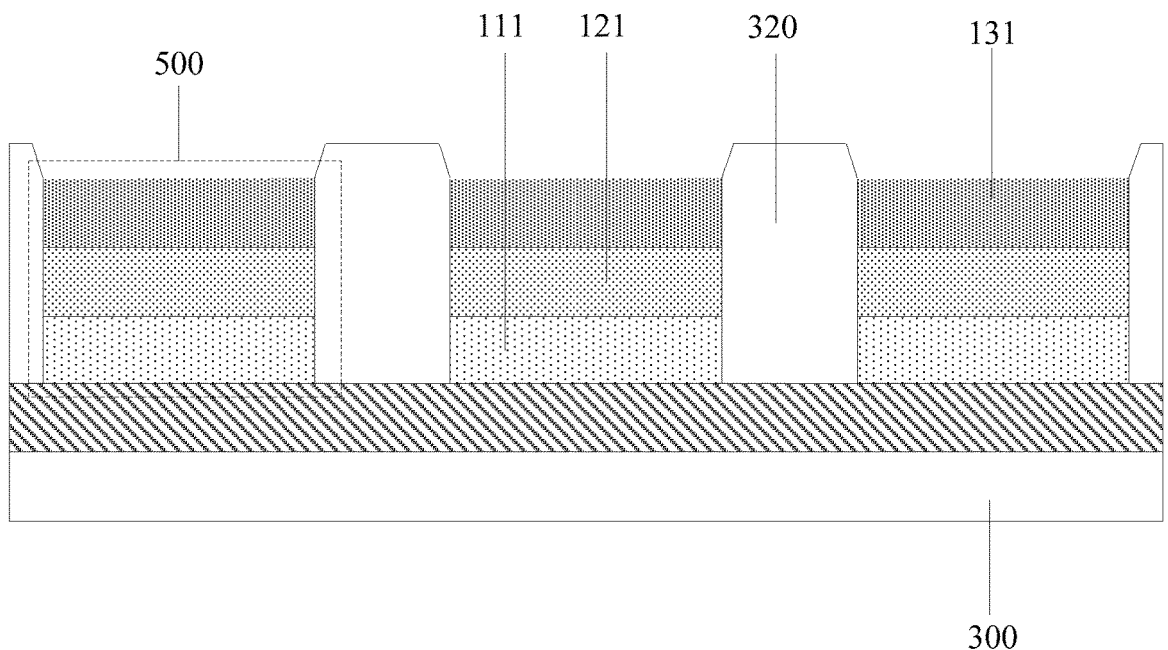

Further, in the above-mentioned preparation method provided by the embodiment of the present disclosure, after the above-mentioned step S102 is performed, the preparation method may further include:
referring to FIG. 4E, a first planarization layer 320 is formed on a film layer on which the photoelectric detection devices 500 are located, and the first planarization layer 320 is patterned to expose the photoelectric detection devices 500. In order to facilitate electrical connection between the photoelectric detection devices and subsequently formed detection signal lines, an orthographic projection of the first planarization layer 320 on the base substrate 300 is not overlapped with orthographic projections of the photoelectric detection devices 500 on the base substrate 300; or, the orthographic projection of the first planarization layer 320 on the base substrate 300 is partially overlapped with the orthographic projections of the photoelectric detection devices 500 on the base substrate 300.

Figure 4F:
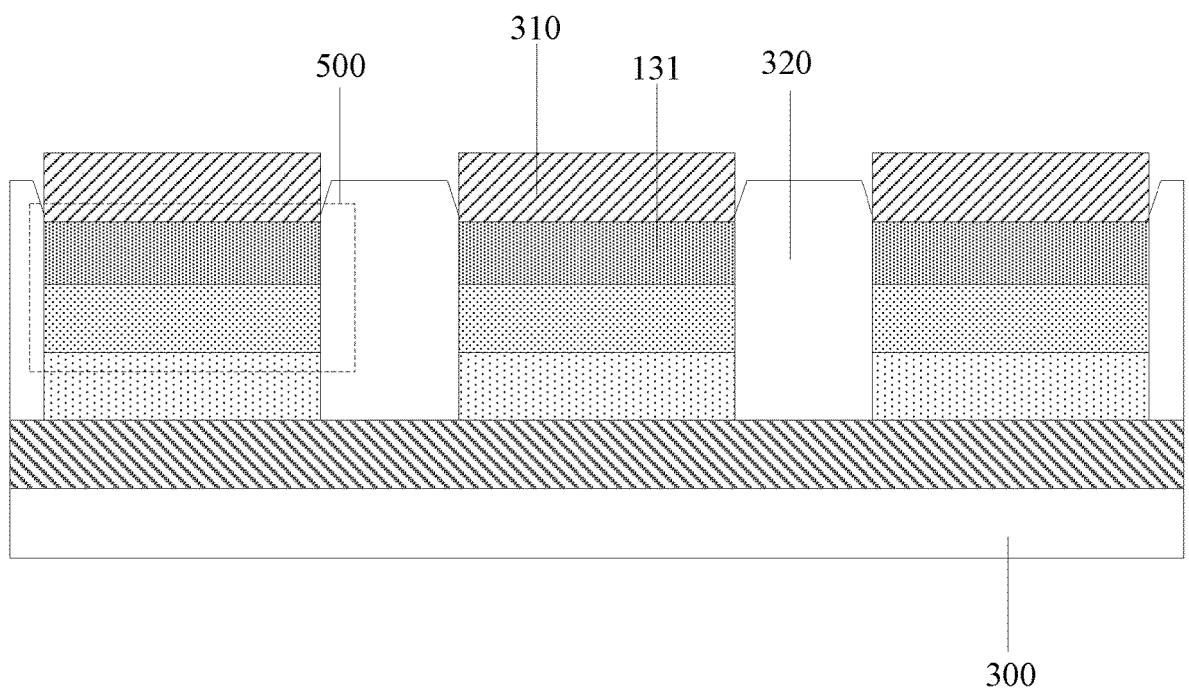

Referring to FIG. 4F, detection signal lines 310 respectively corresponding to the photoelectric detection devices 500 are formed on the first planarization layer 320, and the photoelectric detection devices 500 are electrically connected to the corresponding detection signal lines 310.

Figure 4G:
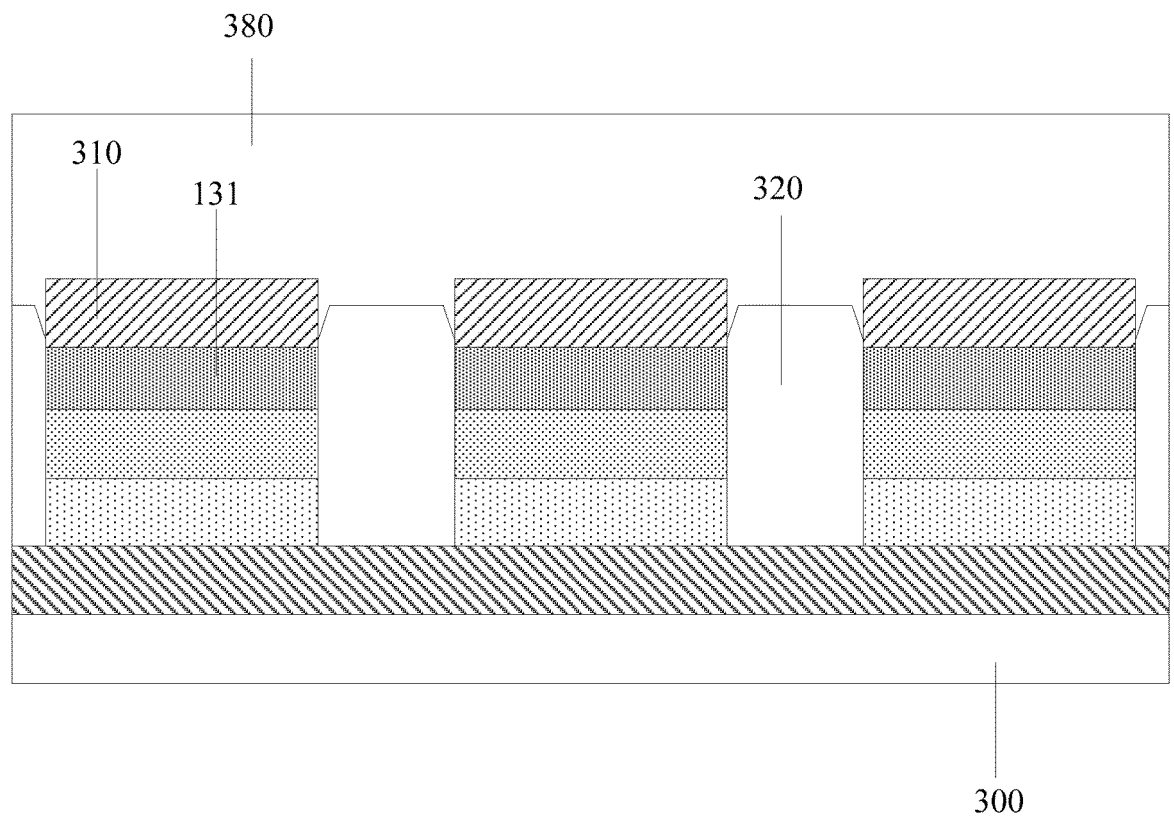

In some embodiments, the preparation method may further include:

referring to FIG. 4G, a protective layer 380 is formed on the detection signal lines 310. In this way, the photoelectric detection devices can be protected, and then, the service life of the photoelectric detection devices can be prolonged.

Figure 4H:
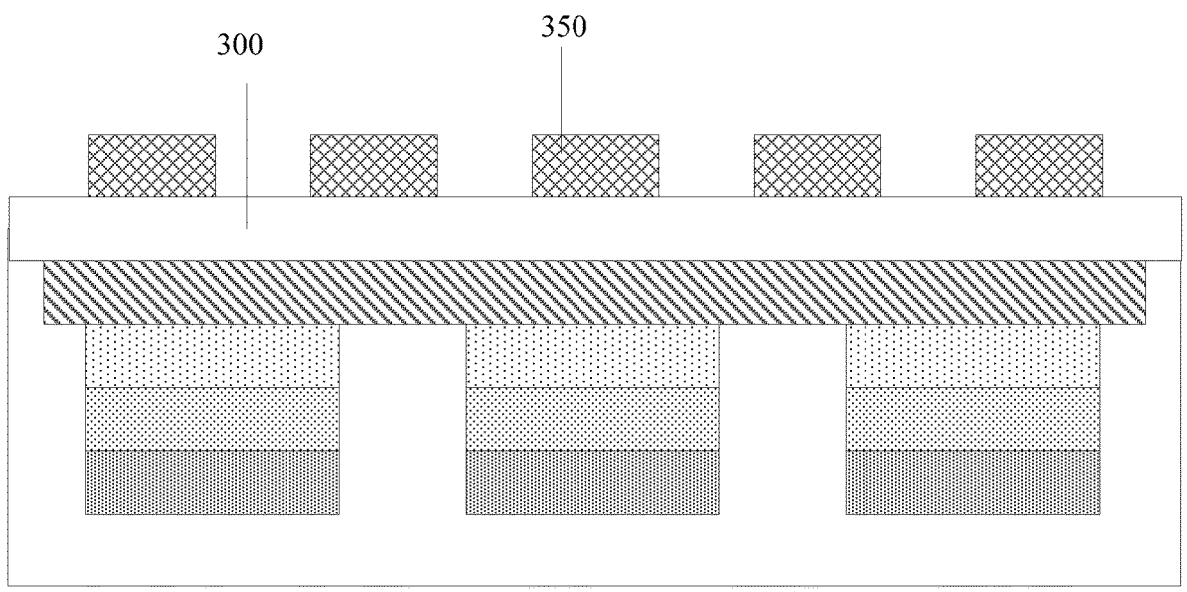

In some embodiments, the above-mentioned step S103 of forming the patterns of the plurality of transparent driving electrodes may specifically include:

patterns of transparent driving electrodes are formed at the side, facing away from the photoelectric detection devices, of the base substrate, as shown in FIG. 4H.

The preparation method of the array substrate, provided by the embodiment of the present disclosure, will be described below with specific embodiments, but a reader should know that the specific process is not limited herein.

The preparation method of the array substrate, provided by the embodiment of the present disclosure, may include the following steps.

(1) A polycrystalline silicon film layer 110, a silicon dioxide film layer 120 and a first electrode layer 130 are sequentially deposited on a third silicon-based substrate 400, as shown in FIG. 4A.

(2) The first electrode layer 130 is patterned to form patterns of a plurality of independent first electrodes 131, and the polycrystalline silicon film layer 110 and the silicon dioxide film layer 120 are patterned to form photoelectric conversion units by adopting photolithography, wherein the photoelectric conversion units may include polycrystalline silicon layers 111 and silicon dioxide layers 121, as shown in FIG. 4B.

(3) A pattern of a common transparent electrode layer 330 is formed on a base substrate 300, as shown in FIG. 4C.

(4) A plurality of photoelectric detection devices 500 are transfer-printed to the base substrate 300 by a transfer substrate by adopting a micro transfer printing process, that is, the first electrodes 131, the polycrystalline silicon layers 111 and the silicon dioxide layers 121 are transfer-printed to the base substrate 300, and the polycrystalline silicon layers 111 are electrically connected to the common transparent electrode layer 330, as shown in FIG. 4D.

(5) A first planarization layer 320 is formed on a film layer on which the photoelectric detection devices 500 are located, and the first planarization layer 320 is patterned to expose the photoelectric detection devices 500. Specifically, an orthographic projection of the first planarization layer 320 on the base substrate 300 is not overlapped or partially overlapped with orthographic projections of the polycrystalline silicon layers 111 on the base substrate 300, as shown in FIG. 4E.

(6) Patterns of detection signal lines 310 in one-to-one correspondence to the photoelectric detection devices 500 are formed at the side, facing away from the base substrate 300, of the first planarization layer 320, so that each first electrode 131 is electrically connected to the corresponding detection signal line 310, as shown in FIG. 4F.

(7) A protective layer 380 is formed at the sides, facing away from the base substrate 300, of the detection signal lines 310, as shown in FIG. 4G.

(8) The base substrate 300 is overturned, and patterns of transparent driving electrodes 350 and patterns of transparent driving electrode traces (not shown in the figure) electrically connected to the transparent driving electrodes 350 are formed at the side, facing away from the photoelectric detection devices, of the base substrate 300, as shown in FIG. 4H.

(9) A first dielectric layer and a first lyophobic layer are sequentially formed on the transparent driving electrodes.

It should be noted that step (3) may be performed before steps (1)-(2) are performed; or step (3) may be performed after steps (1)-(2) are performed. Of course, step (3) may be performed while steps (1)-(2) are performed, there are no limitations herein.

FIG. 4A to FIG. 4H are structural schematic diagrams corresponding to the steps that the photoelectric detection devices are transferred to one side of the base substrate firstly, the base substrate is overturned, and then, the transparent driving electrodes are formed at the other side of the base substrate. In the embodiment of the present disclosure, it is possible that the transparent driving electrodes are formed at one side of the base substrate firstly, the base substrate is overturned, and then, the photoelectric detection devices are transferred to the other side of the base substrate, as shown in FIG. 5A to FIG. 5F. The preparation method in which the transparent driving electrodes are formed firstly, and then, the photoelectric detection devices are transferred will be described in detail below in conjunction with FIG. 5A to FIG. 5F.

Optionally, the preparation method of the array substrate, provided by the embodiment of the present disclosure, may include the following steps.

(1) A polycrystalline silicon film layer 110, a silicon dioxide film layer 120 and a first electrode layer 130 are sequentially deposited on a third silicon-based substrate 400, as shown in FIG. 4A.

(2) The first electrode layer 130 is patterned to form patterns of a plurality of independent first electrodes 131, and the polycrystalline silicon film layer 110 and the silicon dioxide film layer 120 are patterned to form photoelectric conversion units by adopting photolithography, wherein the photoelectric conversion units may include polycrystalline silicon layers 111 and silicon dioxide layers 121, as shown in FIG. 4B.

Figure 5A:
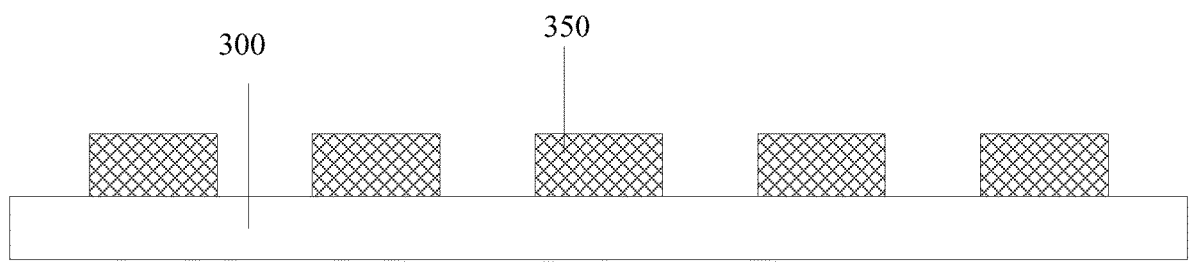
FIG. 5A to FIG. 5F are respectively section-view structural schematic diagrams corresponding to steps performed in embodiments of the present disclosure.

(3) Patterns of transparent driving electrodes 350 and patterns of transparent driving electrode traces (not shown in the figure) electrically connected to the transparent driving electrodes 350 are formed at the side, facing away from the photoelectric detection devices, of a base substrate 300, as shown in FIG. 5A.

Figure 5B:
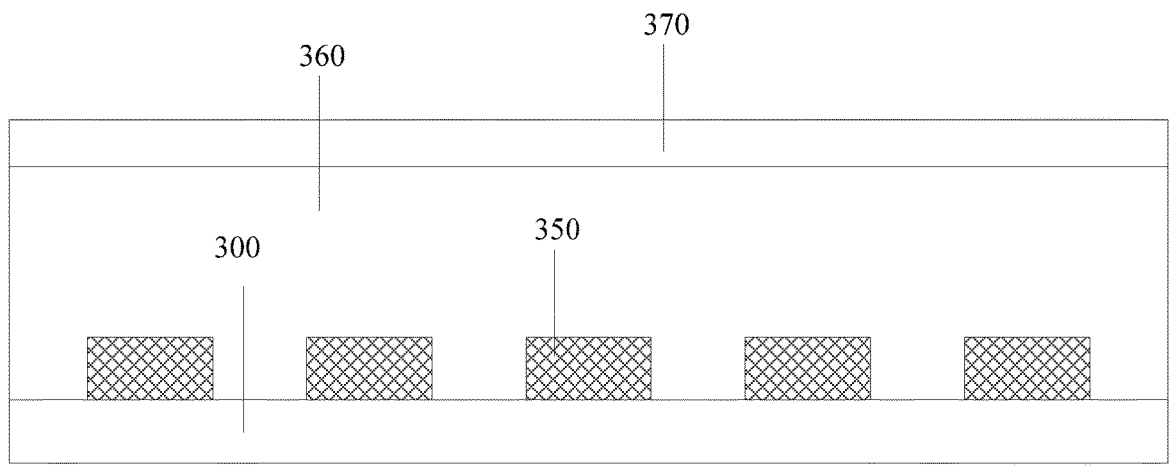

(4) A first dielectric layer 360 and a first lyophobic layer 370 are sequentially formed at the sides, facing away from the base substrate 300, of the transparent driving electrodes 350, as shown in FIG. 5B.

Figure 5C:
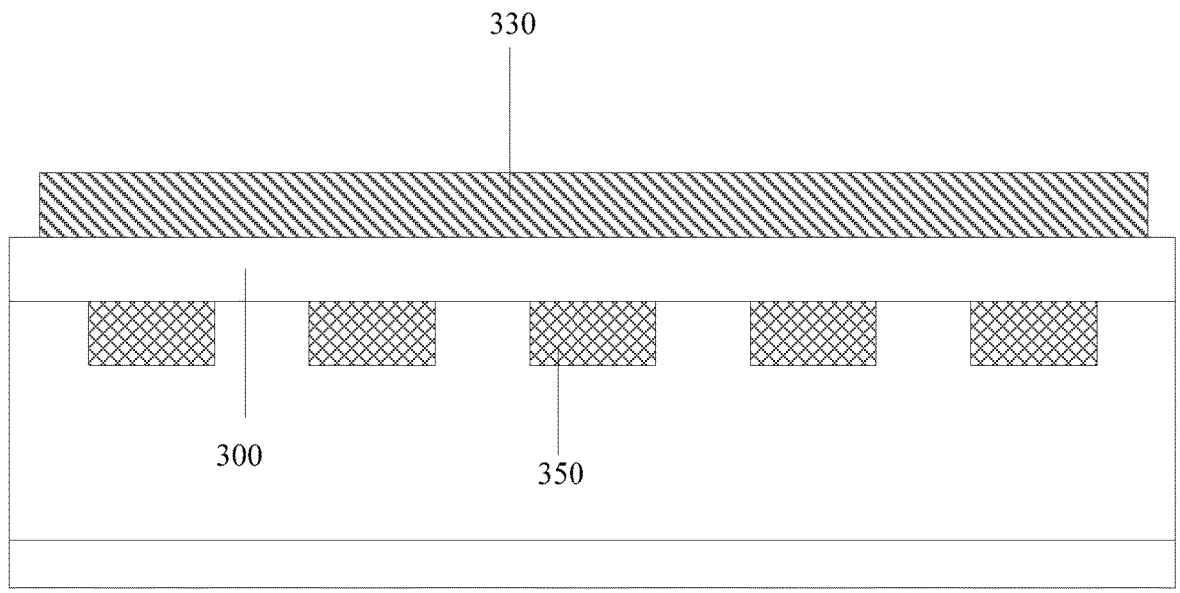

(5) The base substrate 300 is overturned, and a pattern of a common transparent electrode layer 330 is formed at the side, facing away from the transparent driving electrodes 350, of the base substrate 300, as shown in FIG. 5C.

Figure 5D:
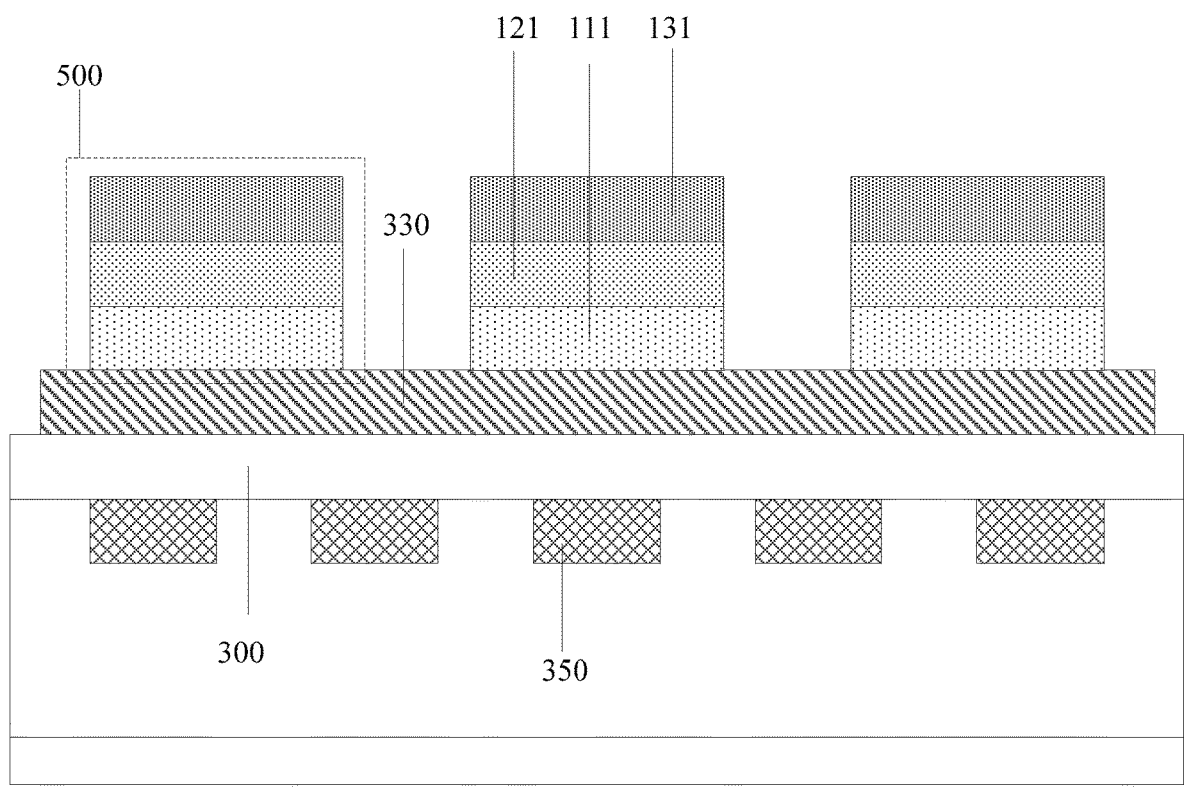

(6) A transfer substrate is adopted to transfer a plurality of photoelectric detection devices 500 to the base substrate 300 by adopting a micro transfer printing process, that is, the first electrodes 131, the polycrystalline silicon layers 111 and the silicon dioxide layers 121 are transfer-printed to the base substrate 300, and the polycrystalline silicon layers 111 are electrically connected to the common transparent electrode layer 330, as shown in FIG. 5D.

(7) A first planarization layer 320 is formed at the sides, facing away from the base substrate 300, of the photoelectric detection devices 500, and the first planarization layer 320 is patterned to expose the photoelectric detection devices 500. Specifically, an orthographic projection of the first planarization layer 320 on the base substrate 300 is not overlapped or partially overlapped with orthographic projections of the polycrystalline silicon layers 111 on the base substrate 300, as shown in FIG. 5E.

Figure 5E:
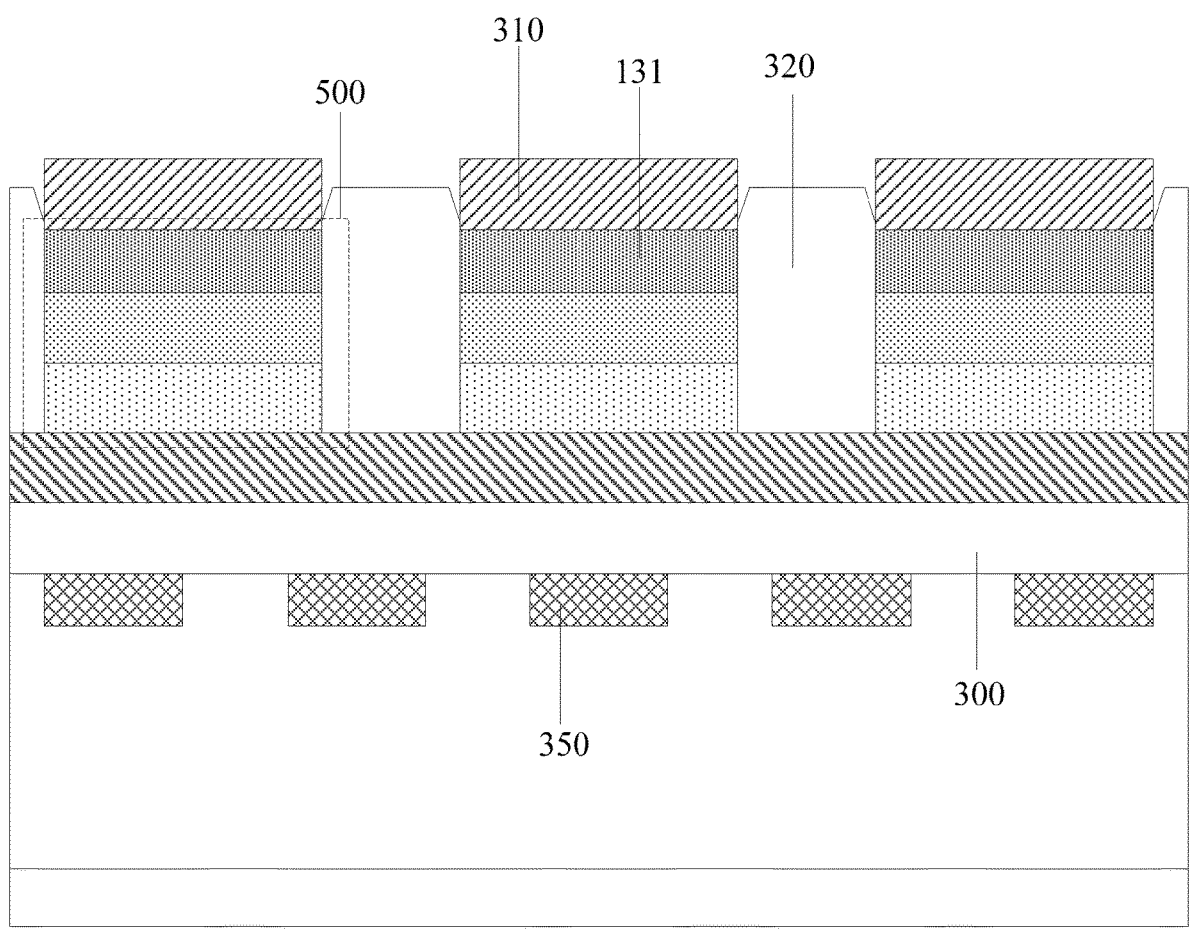

(8) Patterns of detection signal lines 310 in one-to-one correspondence to the photoelectric detection devices 500 are formed at the side, facing away from the base substrate 300, of the first planarization layer 320, so that each first electrode 131 is electrically connected to the corresponding detection signal line 310, as shown in FIG. 5E.

Figure 5F:
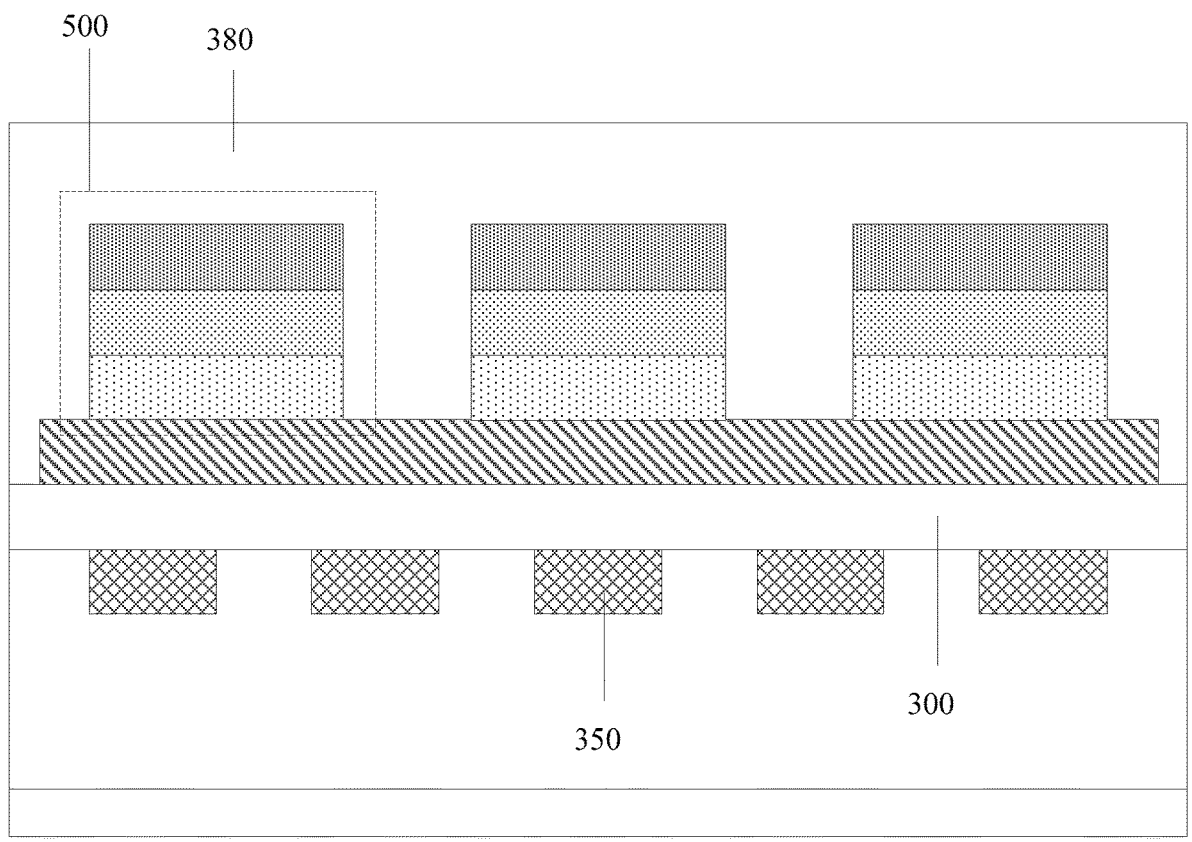

(9) A protective layer 380 is formed at the sides, facing away from the base substrate 300, of the photoelectric detection devices 500, as shown in FIG. 5F.

It should be noted that steps (1)-(2) may be performed before steps (3)-(5) are performed; or steps (1)-(2) may be performed after steps (3)-(5) are performed. Of course, steps (1)-(2) may be performed while steps (3)-(5) are performed, there are no limitations herein.

Based on the same concept, an embodiment of the present disclosure further provides an array substrate prepared by using the preparation method provided by the embodiment of the present disclosure.

In some embodiments, as shown in FIG. 3L and FIG. 5F, the array substrate may include a base substrate 300, and a plurality of photoelectric detection devices 500 located on the base substrate 100 and a plurality of transparent driving electrodes 350. The photoelectric detection devices 500 are insulated from the transparent driving electrodes 350, and the photoelectric detection devices 500 are formed on the base substrate 300 by adopting a micro transfer printing process.

In some embodiments, as shown in FIG. 3L, the transparent driving electrodes 350 are located at the sides, facing away from the base substrate 300, of the photoelectric detection devices 500.

In some embodiments, as shown in FIG. 5F, the transparent driving electrodes 350 are located at the side, facing away from the photoelectric detection devices 500, of the base substrate 300.

In some embodiments, the array substrate may further include a second planarization layer located at the sides, facing away from the base substrate 300, of the transparent driving electrodes 350.

In some embodiments, the array substrate may further include a first lyophobic layer located at the side, facing away from the base substrate, of the second planarization layer.

Based on the same concept, an embodiment of the present disclosure further provides a digital microfluidic chip, including any one of the array substrates mentioned as above. The problem solving principle of the digital microfluidic chip is similar to that of the above-mentioned array substrate, and therefore, the implementation of the digital microfluidic chip may refer to the implementation of the above-mentioned array substrate, the descriptions thereof are omitted herein.

Figure 6:
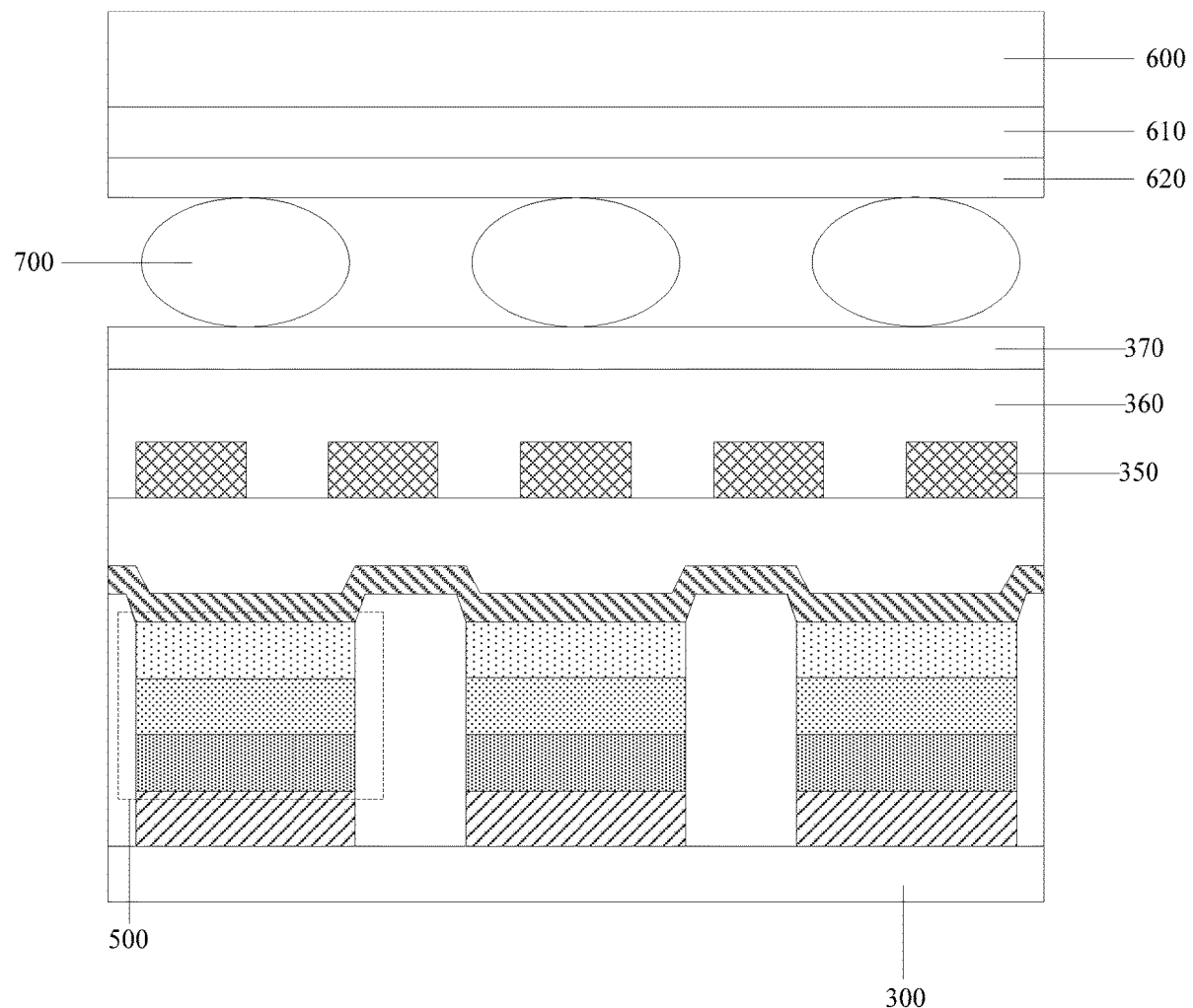
FIG. 6 is a first structural schematic diagram of a digital microfluidic chip according to an embodiment of the present disclosure.
Figure 7:
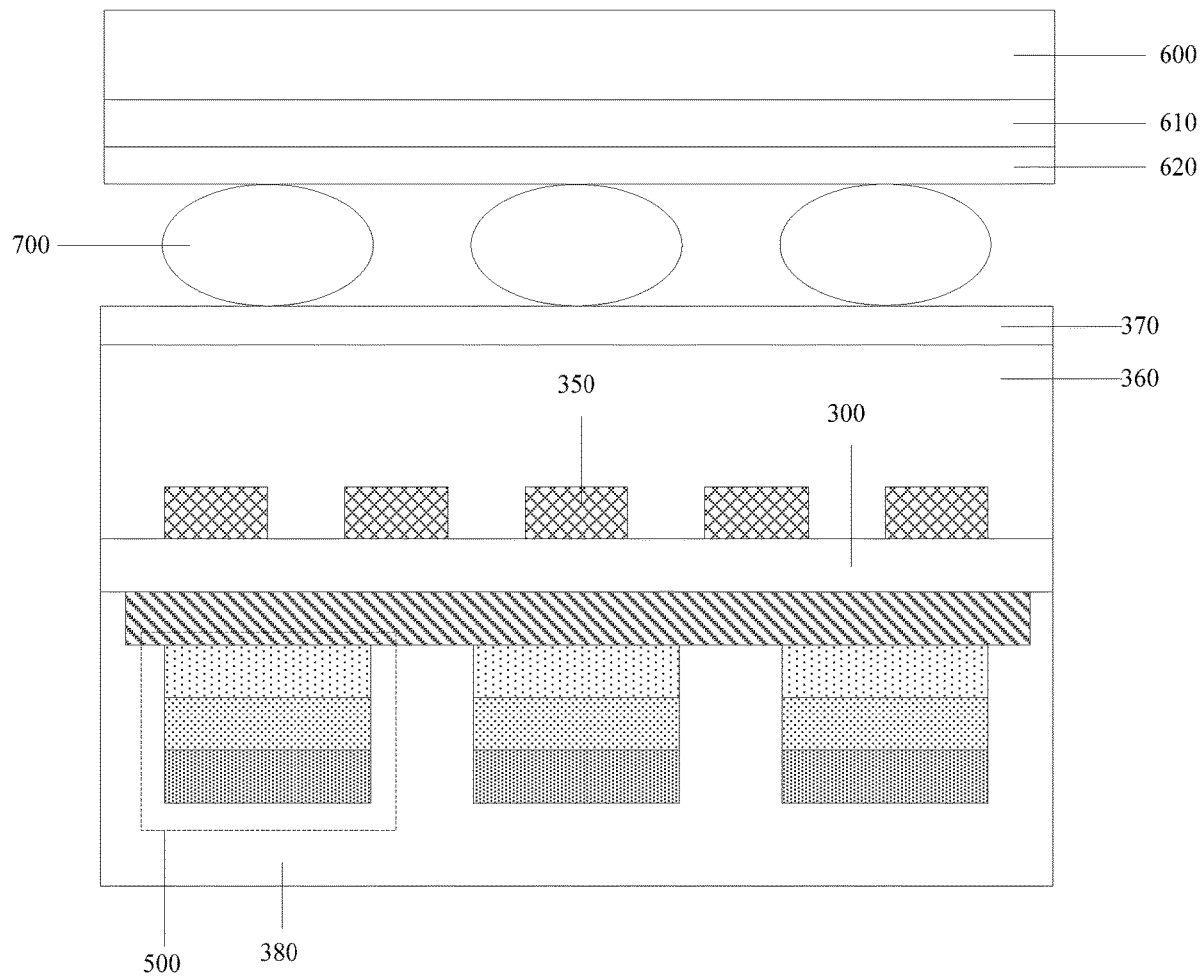
FIG. 7 is a second structural schematic diagram of a digital microfluidic chip according to an embodiment of the present disclosure.

As shown in FIG. 6 and FIG. 7, the array substrate in the above-mentioned digital microfluidic chip may be an array substrate as shown in FIG. 3L or an array substrate as shown in FIG. 5F, but is not limited herein.

In addition, the above-mentioned digital microfluidic chip may further include an opposite substrate which is separated from the array substrate for a set space, and the set space between the array substrate and the opposite substrate can be used for accommodating droplets 700. The movement of the droplets can be controlled by applying an electric signal to transparent driving electrodes 350, and the droplets can be correspondingly detected by reading the electric signal output by photoelectric detection devices 500.

Optionally, the above-mentioned opposite substrate may include a base 600, a second dielectric layer 610 located on the base 600 and a second lyophobic layer 620 located at the side, facing away from the base 600, of the second dielectric layer 610.

According to the array substrate and the preparation method thereof, and the digital microfluidic chip provided by the embodiments of the present disclosure, the micro transfer printing process is based on a silicon-based process, the photodiodes prepared by using the silicon-based process have excellent device performances, accordingly, by forming the photoelectric detection devices on the base substrate by the micro transfer printing process, the problem of poor photoelectric characteristics of the photoelectric detection devices directly prepared from a glass substrate can be solved, and furthermore, the performances of the formed photoelectric detection devices are improved.

Obviously, those skilled in the art can make various alterations and transformations on the present disclosure without departing from the spirit and scope of the present disclosure. In this way, if these alterations and transformations of the present disclosure fall within the scope of the claims of the present disclosure and equivalent technologies of the claims, the present disclosure is also intended to include these alterations and transformations.

We claim:

1. A preparation method of an array substrate applied to a digital microfluidic chip, comprising:

forming a plurality of photoelectric detection devices on a silicon-based substrate;

transferring the photoelectric detection devices to a base substrate by adopting a micro transfer printing process; and forming a plurality of transparent driving electrodes on the base substrate, wherein the transparent driving electrodes are insulated from the photoelectric detection devices;

wherein the forming a plurality of transparent driving electrodes on the base substrate comprises:

forming the plurality of transparent driving electrodes at sides of the photoelectric detection devices facing away from the base substrate after the photoelectric detection devices are transferred to the base substrate;

wherein the forming a plurality of photoelectric detection devices on a silicon-based substrate comprises:

forming a photoelectric conversion film layer and a first electrode layer on a first silicon-based substrate sequentially; patterning the first electrode layer to form patterns of a plurality of first electrodes; forming patterns of a plurality of conductive bonding layers on a second silicon-based substrate, wherein the plurality of conductive bonding layers respectively correspond to the first electrodes; aligning and bonding a side of the first silicon-based substrate provided with the first electrodes and a side of the second silicon-based substrate provided with the conductive bonding layers, and removing the first silicon-based substrate; and patterning the photoelectric conversion film layer to form a plurality of photoelectric conversion units.

2. The preparation method according to claim 1, wherein before the transferring the photoelectric detection devices to a base substrate, the preparation method further comprises:

forming detection signal lines respectively corresponding to the photoelectric detection devices on the base substrate.

3. The preparation method according to claim 2, wherein the transferring the photoelectric detection devices to a base substrate comprises:

picking up the photoelectric detection devices located on the second silicon-based substrate; and transferring the photoelectric detection devices to a surface of the base substrate provided with the detection signal lines, and connecting the first electrodes of the photoelectric detection devices to corresponding detection signal lines electrically.

4. The preparation method according to claim 3, wherein after the transferring the photoelectric detection devices to a base substrate and before the forming a plurality of transparent driving electrodes on the base substrate, the preparation method further comprises:

forming a first planarization layer on a film layer on which the photoelectric detection devices are located, and patterning the first planarization layer to expose the photoelectric detection devices; and forming a common transparent electrode layer on the first planarization layer, and connecting the common transparent electrode layer to the photoelectric detection devices electrically.

5. The preparation method according to claim 4, wherein after the forming a common transparent electrode layer on the first planarization layer and before the forming a plurality of transparent driving electrodes, the preparation method further comprises:

forming a second planarization layer on the common transparent electrode layer; and the forming the plurality of transparent driving electrodes at sides of the photoelectric detection devices facing away from the base substrate comprises:

forming a transparent driving electrode layer on the second planarization layer, and patterning the transparent driving electrode layer to form the transparent driving electrodes.

6. An array substrate, being prepared by using the preparation method according to claim 1.

7. A digital microfluidic chip, comprising the array substrate according to claim 6.

* * * * *